(12) United States Patent
Wieland et al.

(10) Patent No.: US 9,305,747 B2
(45) Date of Patent: Apr. 5, 2016

(54) DATA PATH FOR LITHOGRAPHY APPARATUS

(75) Inventors: Marco Jan-Jaco Wieland, Delft (NL); Teunis Van De Peut, Leusden (NL); Floris Pepijn Van Der Wilt, Voorburg (NL); Ernst Habekotte, Delft (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 1025 days.

(21) Appl. No.: 13/290,139

(22) Filed: Nov. 7, 2011

(65) Prior Publication Data

US 2012/0287410 A1  Nov. 15, 2012

Related U.S. Application Data

(60) Provisional application No. 61/413,396, filed on Nov. 13, 2010, provisional application No. 61/414,775, filed on Nov. 17, 2010, provisional application No. 61/552,479, filed on Oct. 28, 2011.

(51) Int. Cl.
*H01J 37/317* (2006.01)
*B82Y 10/00* (2011.01)
*B82Y 40/00* (2011.01)

(52) U.S. Cl.
CPC ............. *H01J 37/3177* (2013.01); *B82Y 10/00* (2013.01); *B82Y 40/00* (2013.01); *H01J 2237/31762* (2013.01); *H01J 2237/31774* (2013.01)

(58) Field of Classification Search
CPC ................ H01J 37/3177; H01J 2237/31762; H01J 2237/31774
See application file for complete search history.

(56) References Cited

U.S. PATENT DOCUMENTS 4,390,789 A * 6/1983 Smith ................ H01J 37/3177
250/442.11
6,145,438 A   11/2000 Berglund et al.
(Continued)

FOREIGN PATENT DOCUMENTS

WO   WO 2007 004257 A1   1/2007
WO   WO 2007013802 A1    2/2007
WO   WO 2008 013442 A1   1/2008

OTHER PUBLICATIONS

"Multi-tone rasterization, dual pass scan, data path and cell based vector format." IP.Com Journal, IP.Com Inc., US, May 22, 2009.

*Primary Examiner* — Jack Berman
(74) *Attorney, Agent, or Firm* — Hoyng Rokh Monegier LLP; David P. Owen

(57) ABSTRACT

The invention relates to a maskless lithography system for patterning a target using a plurality of charged particle beamlets. The system comprises an electron optical column including a blanker array for modulating the beamlets. The blanker array includes receivers for receiving data signals and blanker elements for modulating the beamlets in accordance with the data signals. The system further comprises a data path comprising a preprocessing system for processing pattern data and a plurality of transmission channels for transmitting processed pattern data to the blanker elements. The data path further comprises a pattern streaming system for receiving pattern data and generating data signals. First and second channel selectors connect a subset of selected transmission channels for pattern data transmission. The first channel selector is connected between the preprocessing system and the transmission channels. The second channel selector is connected between the channels and the blanker elements.

18 Claims, 19 Drawing Sheets

(56) References Cited

U.S. PATENT DOCUMENTS

| | | |
|---|---|---|
| 6,897,458 B2 | 5/2005 | Wieland et al. |
| 6,958,804 B2 | 10/2005 | Wieland et al. |
| 7,019,908 B2 * | 3/2006 | van 't Spijker et al. ....... 359/619 |
| 7,084,414 B2 | 8/2006 | Wieland et al. |
| 7,129,502 B2 | 10/2006 | Kruit |
| 8,198,602 B2 | 6/2012 | Koning |
| 8,884,255 B2 * | 11/2014 | Derks et al. ................ 250/492.2 |
| 2005/0104013 A1 | 5/2005 | Stengl et al. |
| 2007/0064213 A1 | 3/2007 | Jager et al. |
| 2008/0073588 A1 | 3/2008 | Kruit et al. |
| 2009/0212229 A1 | 8/2009 | Wieland et al. |
| 2009/0261267 A1 | 10/2009 | Wieland et al. |
| 2009/0268184 A1 * | 10/2009 | Lin et al. .......................... 355/67 |
| 2011/0073782 A1 | 3/2011 | Wieland et al. |
| 2011/0079730 A1 | 4/2011 | Wieland |
| 2012/0286170 A1 * | 11/2012 | Van De Peut ....... H01J 37/3177 250/397 |

* cited by examiner

DATA PATH FOR LITHOGRAPHY APPARATUS

BACKGROUND OF THE INVENTION

1. Field of the Invention

The present invention relates to a data path for a maskless lithography apparatus, and in particular to a data path for transferring pattern data for control of a plurality of charged particle beamlets.

2. Description of the Related Art

A design for an integrated circuit is typically represented in a computer-readable file containing data for patterning each layer of the integrated circuit onto a silicon wafer. For lithography machines which use masks, this pattern data is typically used to manufacture a mask or set of masks which are then used by the lithography machine for pattering the wafer. For maskless lithography machines, the pattern data file is electronically processed to put it into a format suitable for controlling the lithography machine. For charged particle lithography machines, the pattern data file is converted into a set of data signals for controlling the charged particle beams used in the lithography process.

A data path is typically used to transmit the pattern data from an off-line data processing and storage system to the lithography machine. A very large quantity of data is required to represent the pattern for the current and near future generations of integrated circuit, necessitating a data path having a very high transmission capacity. This very high transmission capacity may be achieved by using a very large number of channels and very high data transmission rates per channel. However, this greatly increases the cost of the data path and it becomes a major component of the overall cost of a charged particle lithography machine.

Due to the very large number of channels, it is likely that a portion of the data path channels will suffer a failure or degradation in capacity and should be not be used. Moreover, designing an efficient connection system between such a large number of channels and the lithography machine is difficult, particularly in view of the need to transmit the data with very high reliability while avoiding use of failed transmission channels.

BRIEF SUMMARY OF THE INVENTION

The present invention seeks to addresses this problem by providing a maskless lithography system for exposing a wafer according to pattern data which uses a data path having features to cope with channel failures. According to one aspect of the invention the lithography system comprises an electron optical column for generating a plurality of charged particle beamlets for exposing the target, the electron optical column including a beamlet blanker array for modulating the beamlets, the beamlet blanker array including a plurality of receivers for receiving beamlet data signals and a plurality of beamlet blanker elements for modulating the beamlets in accordance with the data signals. The lithography system also includes a data path comprising a preprocessing system for storing and processing the pattern data and a plurality of transmission channels for transmitting the processed pattern data from the preprocessing system to the beamlet blanker elements. The data path further comprises a pattern streaming system for receiving the pattern data and generating the beamlet data signals, and first and second channel selectors connecting a subset of selected transmission channels among the transmission channels for transmitting the pattern data, wherein the first channel selector is connected between the preprocessing system and the transmission channels and the second channel selector is connected between the channels and the beamlet blanker elements.

Each input of the first channel selector and each output of the second channel selector may be connected to a limited subset of the transmission channels, and the limited subset of transmission channels for connection to an input of the first channel selector and an output of the second channel selector may comprise nine or less transmission channels. The limited subset of transmission channels may comprise a transmission channel having a default connection to an input of the first channel selector and an output of the second channel selector, and the limited subset of transmission channels may comprise a transmission channel not having a default connection to an input of the first channel selector and an output of the second channel selector.

The system may use an algorithm to determine a connection between an input of the first channel selector and an output of the second channel selector and one of the transmission channels in the limited subset of transmission channels. The algorithm may be adapted to search for a transmission channel which is not used or defective for connection to an input of the first channel selector and an output of the second channel selector. The algorithm may be adapted to perform a search for a mapping between the transmission channels and the inputs of the first channel selector and the outputs of the second channel selector, wherein each input of the first channel selector and the output of the second channel selector is connected to a unique transmission channel that is not defective.

Each input of the first channel selector and output of the second channel selector may have a default connection to a transmission channel. Each input of the first channel selector and each output of the second channel selector may be connected to a limited subset of the transmission channels, the limited subset may include a transmission channel which does not have a default connection to another input of the first channel selector or output of the second channel selector.

The first channel selector and/or the second channel selector may comprise a number of switching circuits arranged in parallel, wherein a first one of the switching circuits is arranged for transmitting an input of the switching circuit to an output of one of a set of adjacent switching circuits. The switching circuits may comprise a plurality of switches connected in two or more series circuits, each switch controllable for passing or blocking a signal at its input. Each switch of a subset of the switches in the series circuits may be arranged for sending its output to an input of a next switch in the series circuit and also to an input of a buffer in an adjacent switching circuit. The set of adjacent switching circuits may comprise a plurality of the switching circuits arranged on both sides of the first switching circuit. Each switching circuit may comprise a plurality of switches connected in two or more series circuits, each switch controllable for passing or blocking a signal at its input, and each of a plurality of the switches in each series circuit may have an output connected to an input of a switch in a series circuit of an adjacent rung, the connections alternating so that successive switch outputs are connected to switch inputs of different ones of the series circuits of the adjacent rungs.

The channel selector may be configured to transmit an input of one of the switching circuits to an output of an adjacent switching circuit along a path defined by selective activation of the switches in the switching circuits according to a predefined pattern. The channel selector may also be configured to utilize a predefined set of unique paths for transmitting an input to a selected one of the outputs, the set of unique paths being defined by a set of predefined activation patterns of the switches in the switching circuits. The channel selector may be configured to transmit an input of one of the switching circuits across one or more intermediate switching circuits to an output of another switching circuit.

The first channel selector may be connected between the preprocessing system and the pattern streamers.

The pattern streaming system may comprise a plurality of pattern streamers comprised in the data path, each pattern streamer for receiving a portion of the pattern data and generating streamed beamlet data signals for modulating a corresponding group of beamlets.

The second channel selector may be connected between the receivers of the beamlet blanker array and the beamlet blanker elements of the beamlet blanker array, for connecting selected receivers to selected beamlet blanker elements to establish transmission channels for transmitting the pattern data for modulation of the beamlets.

The receivers, the second spare channel selector, and the beamlet blanker elements, may all be fabricated on a substrate of the beamlet blanker array. Each receiver may be connected for transmission of beamlet data signals to a group of beamlet blanker elements, and the data path may comprise a plurality of multiplexers and demultiplexers, each multiplexer for multiplexing beamlet data signals for transmission over a transmission channel for control of one of the groups of beamlets. The data path may comprise electrical-to-optical conversion devices for converting the beamlet data signals from electrical signals to optical signals for transmission to the receivers. The transmission channels may comprise optical fibers for transmitting the optical signals.

In another aspect, the system may further comprise a control unit for allocating a selected subset of the beamlets for exposing a selected subset of the surface to be exposed during an exposure, wherein the entire surface to be exposed is exposed in two or more exposures, and wherein the selected subset of beamlets is different for the two or more exposures, and wherein the data path comprises first and second beam selectors for coupling a selected subset of the pattern data via the transmission channels to a selected subset of the beamlet blanker elements during an exposure, wherein the selected subset of the pattern data corresponds to the selected subset of the surface to be exposed during the exposure, and the selected subset of the beamlet blanker elements are for modulation of the selected subset of beamlets for the exposure.

In another aspect the invention provides a data path for transmitting beamlet modulation data to a maskless lithography system, for modulating a plurality of charged particle beamlets generated by the lithography system for exposing a field of a target in two or more passes. The data path comprises a plurality of transmission channels for transmitting the beamlet modulation data to the lithography system, first and second channel selectors connecting a subset of selected transmission channels among the transmission channels for transmitting the pattern data, wherein the first channel selector is connected between a preprocessing system and the transmission channels and the second channel selector is connected between the transmission channels and the lithography system.

Each input of the first channel selector and/or each output of the second channel selector may be connected to a limited subset of the transmission channels. The limited subset of transmission channels for connection to an input of the first channel selector and/or an output of the second channel selector may comprise nine or less transmission channels. The limited subset of transmission channels may comprise a transmission channel having a default connection to an input of the first channel selector and an output of the second channel selector. The limited subset of transmission channels may comprise a transmission channel not having a default connection to an input of the first channel selector and/or an output of the second channel selector.

An algorithm may be used to determine a connection between one of the transmission channels in the limited subset of transmission channels and an input of the first channel selector and/or an output of the second channel selector. The algorithm may be adapted to search for a transmission channel which is not used or defective for connection to an input of the first channel selector and/or an output of the second channel selector.

The algorithm may perform a search for a mapping between the transmission channels and the inputs of the first channel selector and/or the outputs of the second channel selector, wherein each input of the first channel selector and/or each output of the second channel selector is connected to a unique transmission channel that is not defective. Each input of the first channel selector and/or each output of the second channel selector may have a default connection to a transmission channel. Each input of the first channel selector and/or each output of the second channel selector may be connected to a limited subset of the transmission channels, the limited subset including a transmission channel which does not have a default connection to another input of the first channel selector or output of the second channel selector.

The first channel selector and/or the second channel selector may comprise a number of switching circuits arranged in parallel, wherein a first one of the switching circuits is arranged for transmitting an input of the switching circuit to an output of one of a set of adjacent switching circuits. The switching circuits may comprise a plurality of switches connected in two or more series circuits, each switch controllable for passing or blocking a signal at its input. Each switch of a subset of the switches in the series circuits may be arranged for sending its output to an input of a next switch in the series circuit and also to an input of a buffer in an adjacent switching circuit. The set of adjacent switching circuits may comprise a plurality of the switching circuits arranged on both sides of the first switching circuit.

Each switching circuit may comprise a plurality of switches connected in two or more series circuits, each switch controllable for passing or blocking a signal at its input, and wherein each of a plurality of the switches in each series circuit has an output connected to an input of a switch in a series circuit of an adjacent rung, the connections alternating so that successive switch outputs are connected to switch inputs of different ones of the series circuits of the adjacent rungs.

The channel selector may be configured to transmit an input of one of the switching circuits to an output of an adjacent switching circuit along a path defined by selective activation of the switches in the switching circuits according to a predefined pattern. The channel selector may be configured to utilize a predefined set of unique paths for transmitting an input to a selected one of the outputs, the set of unique paths being defined by a set of predefined activation patterns of the switches in the switching circuits. The channel selector may also be configured to transmit an input of one of the switching circuits across one or more intermediate switching circuits to an output of another switching circuit.

The data path may further comprise a pattern streaming system for receiving the pattern data from the preprocessing system and generating the beamlet modulation data and the first channel selector may be connected between the preprocessing system and the pattern streaming system. The pattern streaming system may comprise a plurality of pattern streamers comprised in the data path, each pattern streamer for receiving a portion of the pattern data and generating streamed beamlet data signals for modulating a corresponding group of beamlets.

In another aspect, the invention relates to a channel selector for a data path for transmitting data via a plurality of transmission channels, the channel selector adapted to connect a subset of selected transmission channels among the plurality of transmission channels, wherein each input of channel selector may be connected to a limited subset of the transmission channels and wherein an algorithm is used to determine a connection between an input and an output of the channel selector.

The algorithm may be adapted to search for a transmission channel which is not used or defective for connection to an output of the channel selector, and may be adapted to perform a search for a mapping between the transmission channels and the outputs of the channel selector, wherein each output of the channel selector is connected to a unique transmission channel that is not defective. Each output of the channel selector may have a default connection to a transmission channel. Each output of the channel selector may be connected to a limited subset of the transmission channels, the limited subset including a transmission channel which does not have a default connection to another output of the channel selector.

The channel selector may comprise a number of switching circuits arranged in parallel, wherein a first one of the switching circuits is arranged for transmitting an input of the switching circuit to an output of one of a set of adjacent switching circuits.

The switching circuits may comprise a plurality of switches connected in two or more series circuits, each switch controllable for passing or blocking a signal at its input. Each switch of a subset of the switches in the series circuits may be arranged for sending its output to an input of a next switch in the series circuit and also to an input of a buffer in an adjacent switching circuit. The set of adjacent switching circuits may comprise a plurality of the switching circuits arranged on both sides of the first switching circuit.

Each switching circuit may comprise a plurality of switches connected in two or more series circuits, each switch controllable for passing or blocking a signal at its input, and each of a plurality of the switches in each series circuit may have an output connected to an input of a switch in a series circuit of an adjacent rung, the connections alternating so that successive switch outputs are connected to switch inputs of different ones of the series circuits of the adjacent rungs.

The channel selector may be configured to transmit an input of one of the switching circuits to an output of an adjacent switching circuit along a path defined by selective activation of the switches in the switching circuits according to a predefined pattern. The channel selector may be configured to utilize a predefined set of unique paths for transmitting an input to a selected one of the outputs, the set of unique paths being defined by a set of predefined activation patterns of the switches in the switching circuits. The channel selector may be configured to transmit an input of one of the switching circuits across one or more intermediate switching circuits to an output of another switching circuit.

BRIEF DESCRIPTION OF THE DRAWINGS

Various aspects of the invention and certain examples of embodiments of the invention are illustrated in the drawings in which.

DESCRIPTION OF ILLUSTRATIVE EMBODIMENTS

The following is a description of various embodiments of the invention, given by way of example only and with reference to the drawings.

Charged Particle Lithography System

Figure 1:
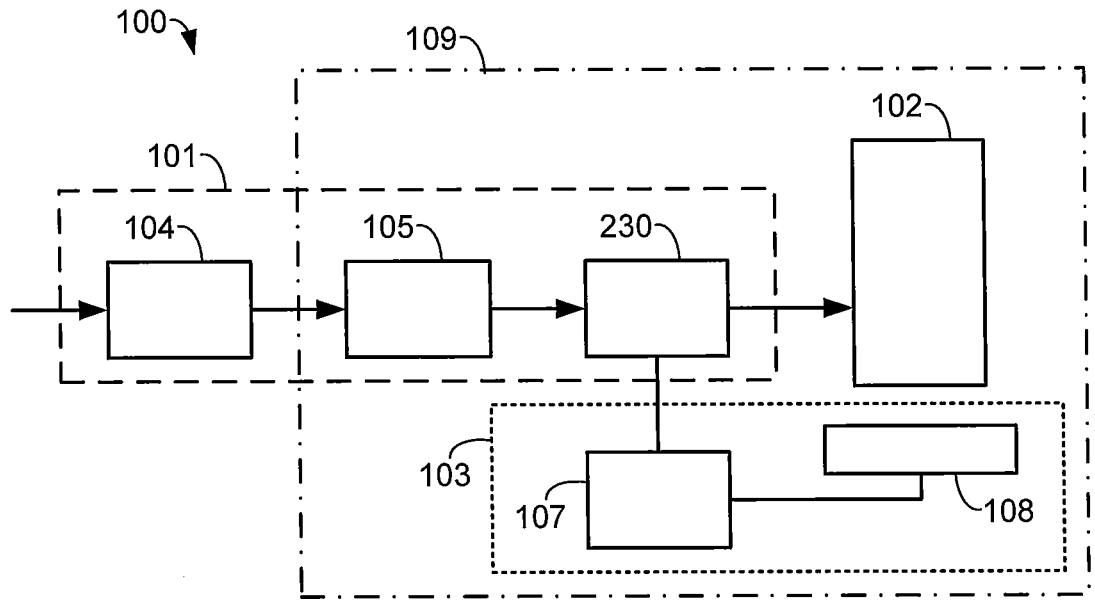
FIG. 1 is a conceptual diagram showing a maskless lithography system.

FIG. 1 is a conceptual diagram showing a maskless lithography system 100 divided into three high level sub-systems: a data path 101, a lithography machine column 102, and wafer positioning system 103. The lithography machine column 102 generates optical or charged particle beams for exposing a wafer according to pattern data provided by the data path. The wafer positioning system 103 moves the wafer under the column 102 to enable scanning of the wafer by the exposure beams generated by the column 102.

The wafer positioning system 103 typically includes a control system 107 for controlling movement of a wafer table 108 on which the wafer is placed. In one embodiment, the wafer positioning system moves the wafer in an y-direction (according to the SEMI M20 coordinate system) while the beams are swept across the surface of the wafer in a x-direction perpendicular or nearly perpendicular to the y-direction. The wafer positioning system is provided with synchronization signals from the data path 101 to synchronize the positioning of the wafer under the exposure beams with the pattern data transmitted to the column by the data path.

The column 102 generates optical or charged particle beams (or other types of beams suitable for lithography) for exposing the wafer. The beams are scanned across the surface of the wafer and modulated in synchronization with the scanning according to pattern data provided by the data path. The modulation of the beams may be performed by switching individual beams or groups of beams on and off, or by modulating their intensity, resulting in an exposure pattern on the surface of the wafer which corresponds to the pattern data.

The data path 101 may include an off-line processing system 104, an "in-line" processing system 105, and a pattern streaming system 230. The off-line processing system 104 receives pattern data representing features to be reproduced on the wafer, usually for making one layer of a semiconductor integrated circuit. The pattern data is usually generated in vector format, and the off-line processing system performs various preprocessing operations on the data in preparation for its use in the lithography machine. The preprocessed pattern data is then uploaded to the lithography tool 109 for storage and further processing by the "in-line" processing system 105. When exposure of a wafer is to take place, the processed pattern data is transferred to the pattern streaming system 106 for streaming to the column 102.

The components are typically arranged as two separate groups of equipment, an off-line processing system 104 and a lithography machine 109, also referred to as a lithography tool. The lithography tool typically includes the wafer positioning system 103, lithography machine column 102, in-line processing system 105, and pattern streaming system 106.

Figure 2A:
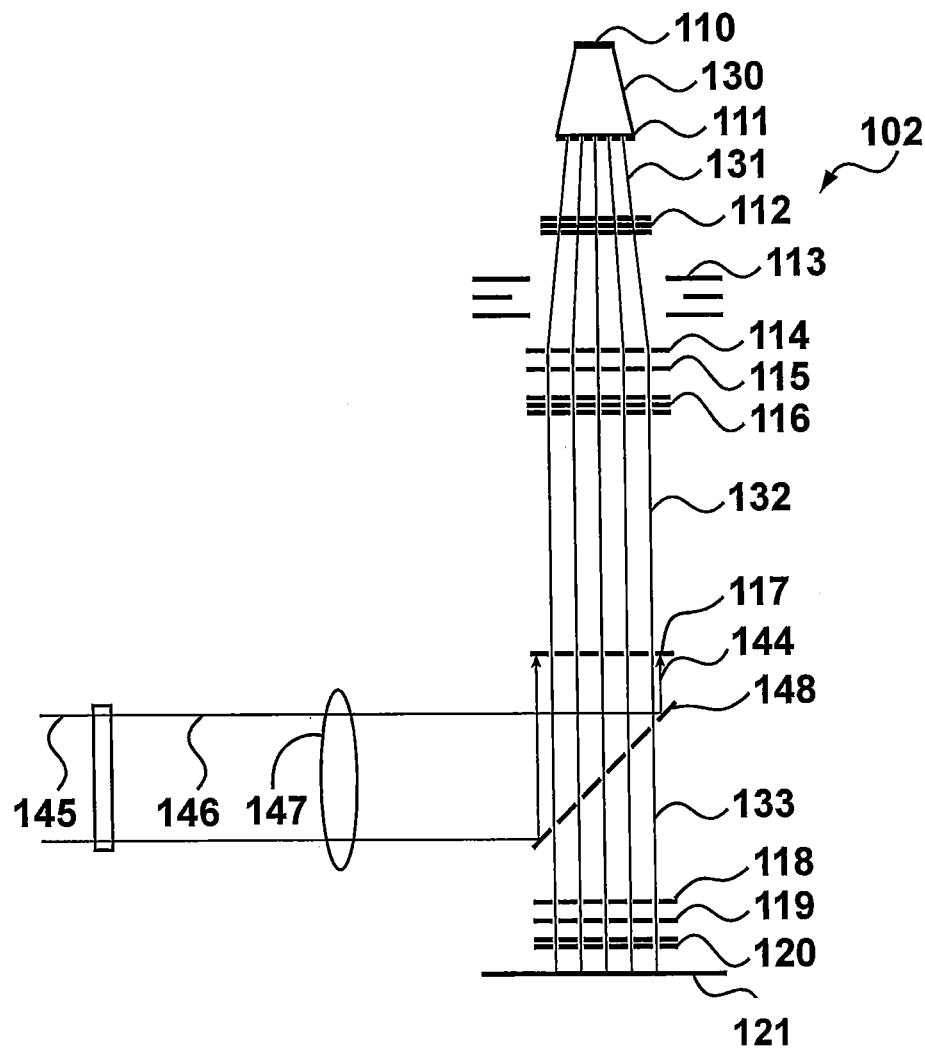
FIG. 2A is a simplified schematic drawing of an embodiment of a charged particle lithography system.
Figure 2B:
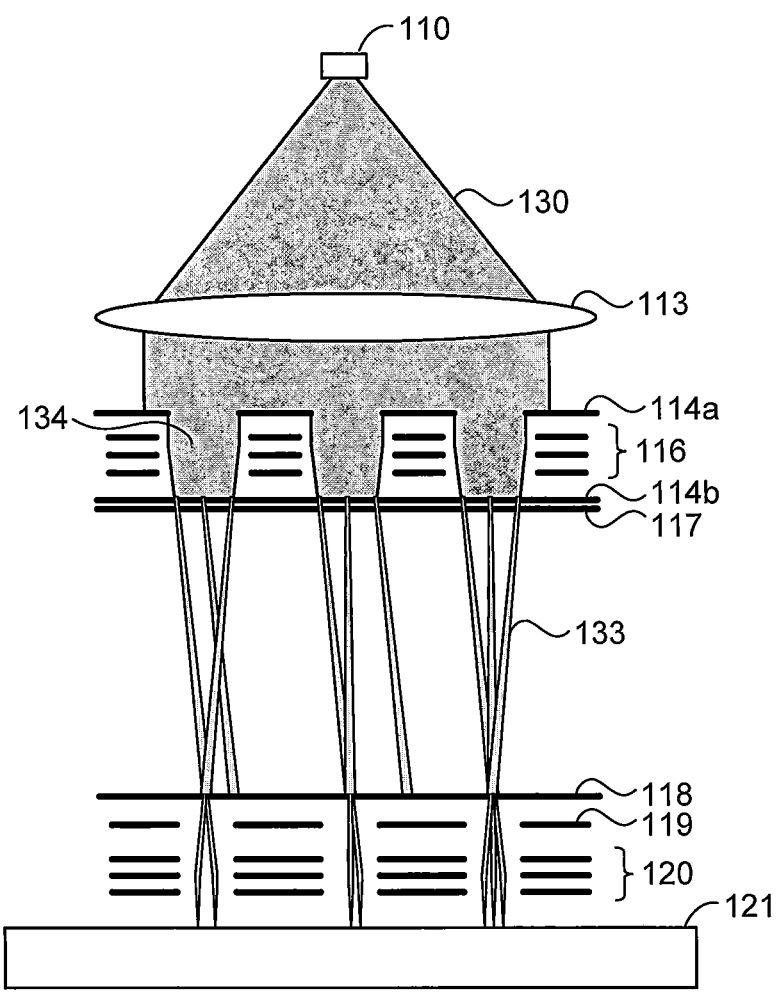
FIG. 2B is a simplified schematic drawing of a second embodiment of a charged particle lithography system.

FIGS. 2A and 2B are simplified schematic diagrams of a charged particle lithography system 100 showing one possible embodiment of a electron optical column 102. Such lithography systems are described for example in U.S. Pat. Nos. 6,897,458; 6,958,804; 7,019,908; 7,084,414 and 7,129,502, and U.S. patent application publication no. 2007/0064213; 2009/0261267 and 2009/0212229, and co-pending U.S. patent application Ser. Nos. 12/905,126; 61/055,839; 61/058,596 and 61/101,682, which are all assigned to the owner of the present application and are all hereby incorporated by reference in their entirety.

In the embodiment shown in FIG. 2A, the lithography system comprises a charged particle source 110, e.g. an electron source for producing an expanding electron beam 130. The expanding electron beam 130 impinges on an aperture array 111, which blocks part of the beam to create a plurality of beamlets 131. The system generates a large number of beamlets, preferably in the range of about 10,000 to 1,000,000 beamlets.

The electron beamlets 131 pass through a condenser lens array 112 which focuses the electron beamlets 131. The beamlets 131 are collimated by collimator lens system 113. The collimated electron beamlets pass through XY deflector array 114, a second aperture array 115, and second condenser lens array 116. The resulting beamlets 132 next pass through beam blanker array 117, comprising a plurality of blankers for deflecting one or more of the beamlets. The beamlets pass through mirror 148 and arrive at beam stop array 118, which has a plurality of apertures. The beamlet blanker array 117 and beam stop array 118 operate together to switch the beamlets on or off, by either blocking beamlets or letting them pass. The beamlet blanker array 117 can deflect a beamlet so that it will not pass through a corresponding aperture in beam stop array 118, but instead will be blocked. If beamlet blanker array 117 does not deflect a beamlet, then it will pass through the corresponding aperture in beam stop array 118. The undeflected beamlets pass through the beam stop array, and through a beam deflector array 119 and projection lens arrays 120.

Beam deflector array 119 provides for deflection of each beamlet 133 in the x- and/or y-direction, substantially perpendicular to the direction of the undeflected beamlets, to sweep the beamlets across the surface of wafer or target 121. This deflection is separate from the deflection used by the beamlet blanker array to switch the beamlets on or off. Next, the beamlets 133 pass through projection lens arrays 120 and are projected onto target 121. The projection lens arrangement preferably provides a demagnification of about 100 to 500 times. The beamlets 133 impinge on the surface of target 121 positioned on a moveable stage of the wafer positioning system 103. For lithography applications, the target usually comprises a wafer provided with a charged-particle sensitive layer or resist layer.

The representation shown in FIG. 2A is much simplified. In the embodiment shown in FIG. 2B, a single electron beam 130 is collimated by lens system 113 and is then partitioned into many smaller subbeams 134 by first aperture array 114a. The subbeams 134 are focused by condenser arrays 116 and are then split into an even larger number of beamlets by second aperture array 114b. Such a system is described in U.S. patent application Ser. No. 12/905,126, which is hereby incorporated by reference in its entirety. Although only three subbeams and nine beamlets are shown in the diagram, a large number of subbeams and beamlets are generated by the system, as discussed in more detail below.

In this system each subbeam is split into a number of beamlets which, together, can be considered a patterned beam. In one embodiment, each subbeam is split into 49 beamlets arranged in a 7×7 array. The beamlet blanker array preferably comprises one hole with an associated blanker electrode for each beamlet, to enable on/off switching of each individual beamlet. The arrangement of beamlets in a patterned beam and writing strategies are described for example in U.S. patent application Ser. No. 12/960,675, which is hereby incorporated by reference in its entirety. The beam deflector array and projection lens array preferably include only one hole and lens for each patterned beam (e.g. one hole or lens for each group of 49 beamlets making up one patterned beam). A group of beamlets is preferably arranged to expose a single stripe on the wafer, and the data for controlling modulation (e.g. switching on or off) of the beamlets in a group is typically combined (interleaved/multiplexed) and transmitted in a group, e.g. for writing a single stripe.

Data Path Architecture

Figure 3:
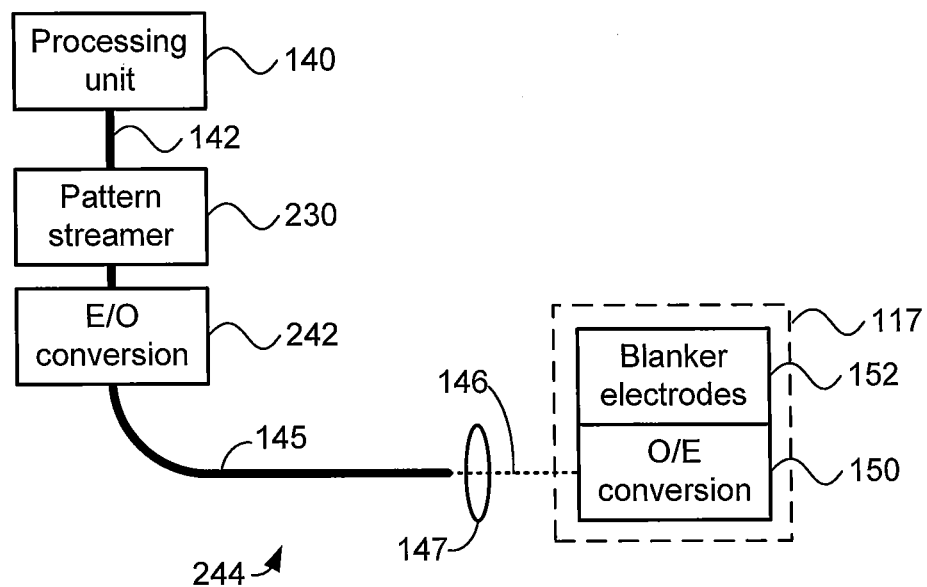
FIG. 3 is a simplified diagram of a data path including an optical path.

A simplified block diagram of one embodiment of a data path 101 is shown in FIG. 3, and a portion of the data path also appears in FIG. 2A. The switching of beamlet blanker array 117 is controlled via the data path. A processing unit 140 receives information describing the layout of the device to be manufactured by the lithography machine, typically provided in a vector file format. The processing unit (which may include an off-line processing system 104, and/or an in-line processing system 105 performs a series of transformations of this information to generate data for control of the beamlet blanker array 117.

The data is transmitted via channels 142 to pattern streamer 230 and the signals are then streamed to electro-optical conversion devices 242, such as laser diodes, to convert the electrical data signals into optical signals. The optical control signals are then transmitted via transmission system 244, in this embodiment comprising optical fibers 145, free space light beams 146, microlenses 147 (and mirror 148 in the configuration shown in FIG. 2A). The optical data signals are guided through optical fibers 145. Free space light beams 146 at the output of the fibers may be guided through optical devices such an array of microlenses 147. The individual light beams are directed onto a plurality of optical-to-electrical conversion devices 150, such as photo diodes, which are preferably located on a surface of the beam blanker array 117. Preferably, for every optical fiber 145 there is a corresponding photo diode 150 on the beamlet blanker array. The photo diodes convert the optical data signals into electrical signals to activate the individual beam blanker electrodes 152 to modulate the beamlets 132 or control the deflection of beamlets 132 to switch the individual beamlets on or off.

The ends of the optical fibers 145 may be mounted very close to the optical-to-electrical conversion devices 150 so that the free space light beams 146 are very short, and the microlenses and mirror omitted may be omitted. This may be implemented to achieve a mechanical separation of the optical fibers and beamlet blanker. Alternatively, the free space light beams may travel over a longer path. In one embodiment, the free space light beams are directed onto a holey mirror 148 which is angled so that the light beams are reflected onto the underside of beam blanker array 117 where the optical-to-electrical conversion devices 150 are located. The ends of the optical fibers may also be mounted to that there are no free space light beams at all.

The data signals for controlling the individual beamlet blanker electrodes, and control signals such as synchronizing and clock signals, are preferably time or frequency multiplexed, so that each optical fiber 145 and light beam 146 carries signals for a channel comprising a number of beamlets that, e.g., share one laser diode, one optical fiber and photo diode. The multiplexed light beams are received by the photo diodes 150 and converted into an electrical signal. The beamlet blanker array 117 includes logic for demultiplexing each signal received by a photo diode to derive multiple signals for individually controlling a number of beamlet blanker electrodes 152. In a preferred embodiment, individual signals for controlling a single group of beamlets forming one patterned beam, e.g. 49 beamlets, are time multiplexed for transmission over a single optical fiber, and are received by a single photo diode on the beamlet blanker array.

In addition to multiplexing, the beamlet data and control signals may also be arranged in frames for transmission and may have synchronisation bits and additional encoding to improve transmission, e.g. using an encoding technique to achieve frequent signal transitions, to avoid using the laser diodes and photo diodes in a DC-coupled fashion. By forcing transitions, the clock signal may be also automatically distributed in the optical signal.

Closer to the wafer the beam deflector array 119 is used to deflect the electron beamlets in the x-direction (also accompanied by a small deflection in the y-direction) to achieve scanning of the electron beamlets over the surface of the wafer 121. In the described embodiment, the wafer 121 is mechanically moved in the y-direction by the wafer positioning system 101, and the electron beamlets are swept across the wafer in a x-direction substantially perpendicular to the y-direction. When writing data, the beamlets are deflected slowly (compared to the fly-back time) in the x-direction. At the end of a sweep, the beamlets are moved quickly back to the start position of the x-range (this is referred to as the fly-back). The beam deflector array 119 receives timing and synchronization information from the data path 101 for controlling this beamlet sweep. Note that the term "scan" in the following description refers to scanning the beamlets over the wafer in the y-direction, typically as a result of moving the wafer in a y-direction.

Figure 4A:
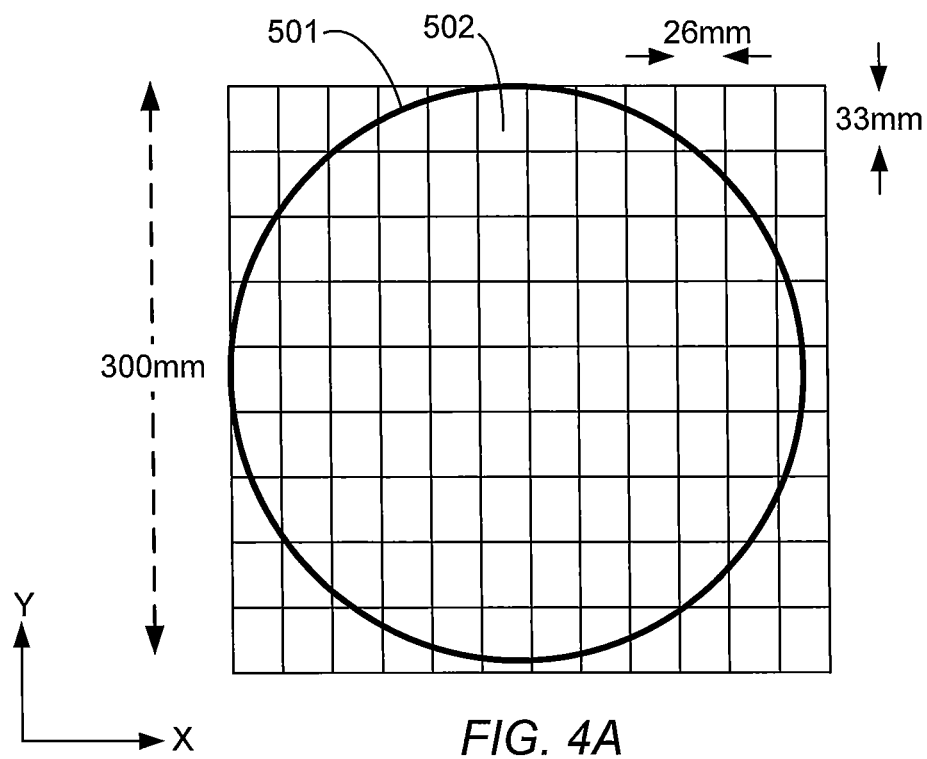
FIG. 4A is a diagram of a wafer divided into fields.

The current lithography industry standard is a 300 mm wafer. FIG. 4A shows a wafer 501 divided into fields 502. Rectangular fields are usually defined on the surface of the wafer, typically with a maximum dimension of 26 mm×33 mm. Each field may be processed to produce multiple semiconductor devices (i.e. the pattern data for exposing a single field may include the layout design for making multiple integrated circuit devices) but the layouts for individual devices do not typically cross a field border. With a maximum size of 26 mm×33 mm there are typically 63 complete fields available on a single standard wafer. Smaller fields are possible and will result in a higher number of fields per wafer. The pattern data usually describes the features of a single field, and the same pattern data is usually used for the entire wafer, so that each field of the wafer is exposed with the same pattern. It is also possible to write partial (incomplete) fields, for example by writing full fields into the partial area crossing a wafer boundary.

Figure 4B:
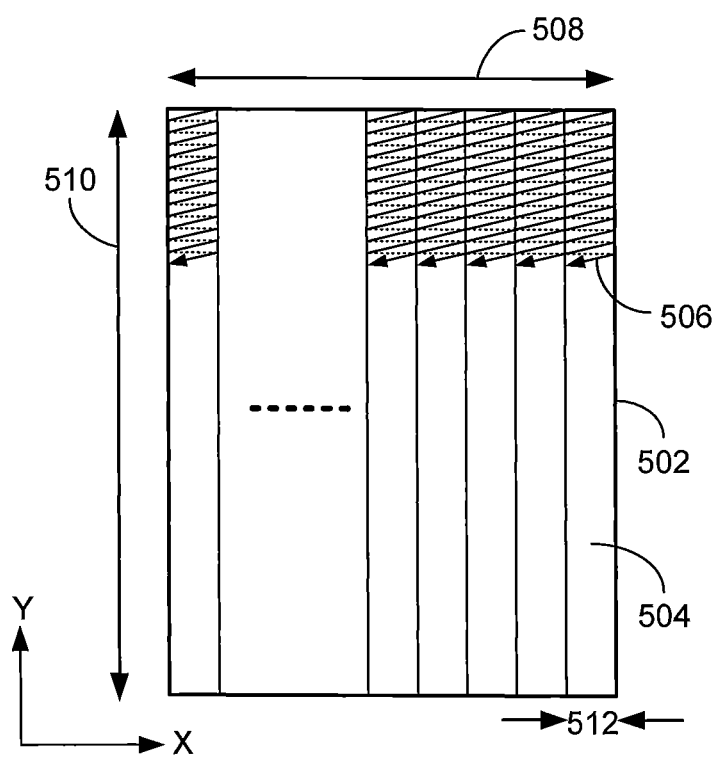
FIG. 4B is a diagram showing writing direction for a wafer field.

FIG. 4B is a schematic diagram of a field 502 of width 508 (e.g. 26 mm) and length 510 (e.g. 33 mm), the field divided into stripes 504 of width 512 (e.g. 2 micrometers) running the length of the field in the y-direction. The writing direction and sweep of the beamlets in each stripe is illustrated by the lines 506, showing the beamlet deflection in the x-direction while the wafer stage moves in the y-direction, and the return sweep, creating a triangular shaped writing path. Note, that the beamlets typically only write while sweeping in one direction, and are turned off during the return sweep (returning beamlets to the starting x position). The wafer is preferably written on (exposed) by the lithography machine in both a forward and backward y-direction (i.e. +y and −y direction). The direction of writing in the x-direction (by the beamlet scan deflector) is usually in one direction.

Figure 4C:
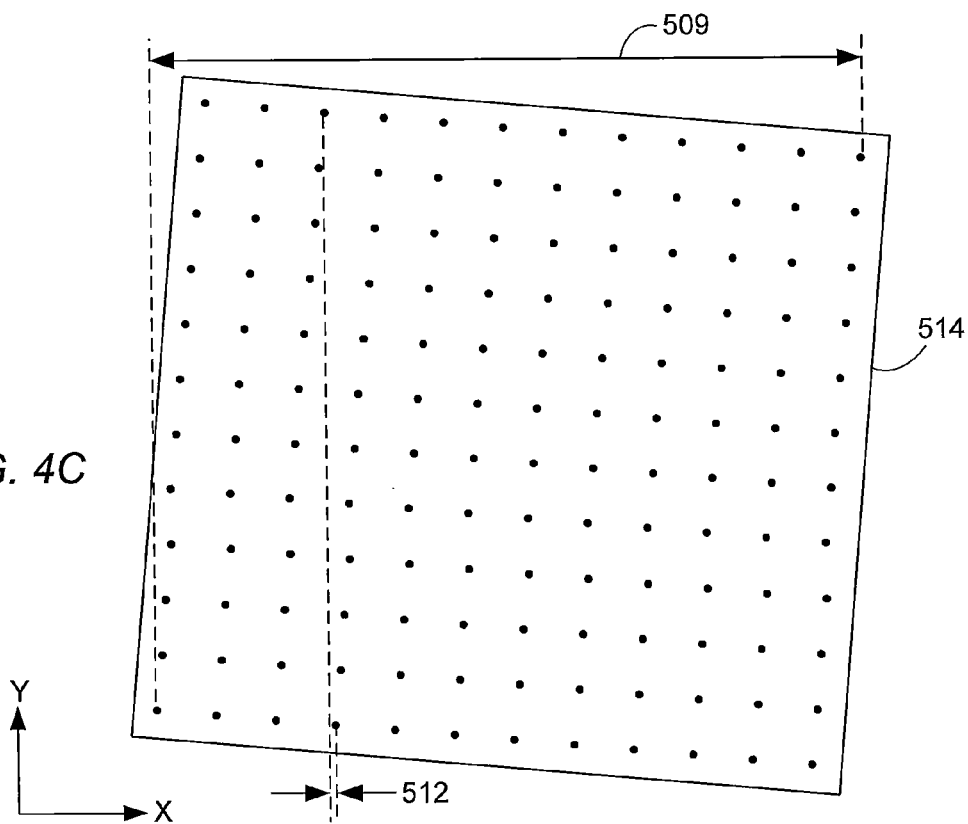
FIG. 4C is a diagram of an arrangement of subbeams for exposing a wafer field.
Figure 4D:
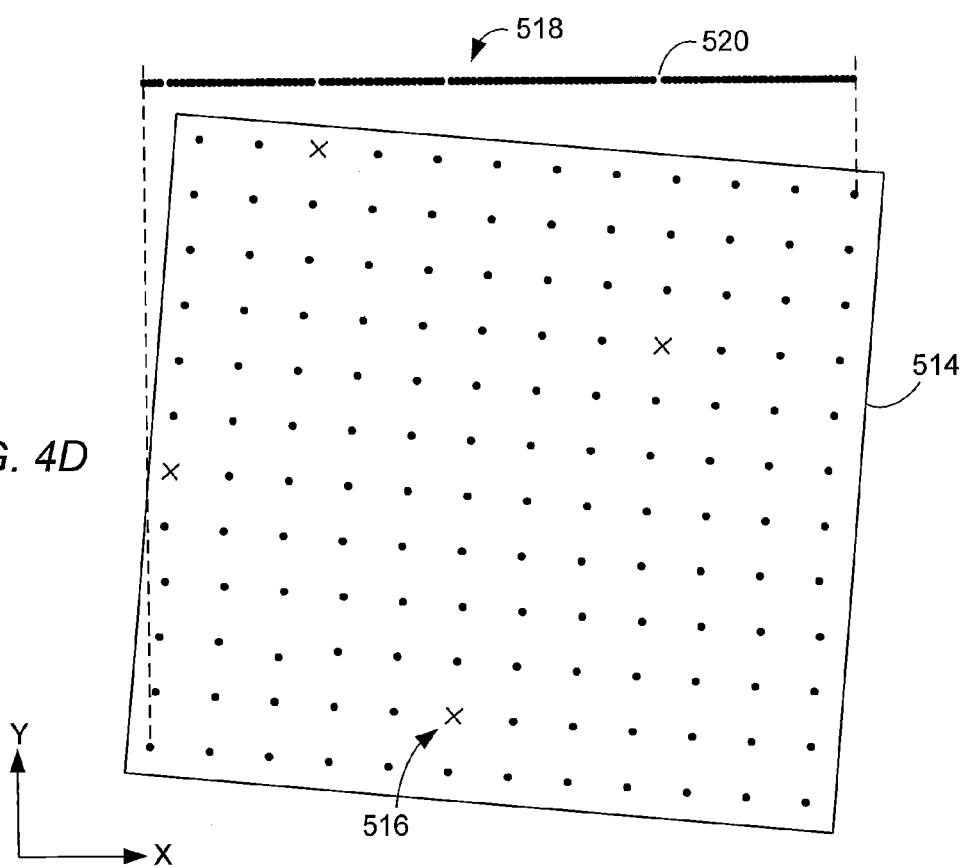
FIG. 4D is an illustration of failed subbeams in the arrangement of FIG. 4C.

FIG. 4C shows a possible of arrangement of an array of beams 514 for exposing a wafer field, each beam being represented by a dot. In the following description these beams are referred to as subbeams (which may each comprise a number of beamlets), although the description could also apply for an array of beamlets. The subbeams 514 are arranged in a tilted array, the width 509 of the array of subbeams in the x-direction being substantially the same or slightly greater than the width 508 of the field, and the distance 512 between adjacent subbeams in the x-direction (the pitch) being substantially the same as the width of one stripe of the field. In this arrangement, each subbeam writes a single stripe of the field. Furthermore, each subbeam may be a patterned beam comprising a number of beamlets. In FIG. 4D the beam arrangement of FIG. 4C is shown with a number of failed or out-of-specification subbeams 516 indicated with an "X". The subbeams are shown projected into a line 518 in the x-direction, illustrating the gaps 520 resulting from failed or out-of-specification subbeams (when projected onto line 518, the subbeams will actually have a gap between them equal to the pitch of distance 512). As the wafer is moved in the y-direction during a first pass of the exposure, the subbeams write along the length of the stripes of a field. The stripes falling under the gaps 520 will not be written. The wafer can be shifted slightly in the x-direction so that functioning subbeams are aligned with the stripes that were not written in the first pass. A second pass can then be performed, so that the stripes missed on the first pass are now written by functioning subbeams.

When the size (width 508) of a field is chosen to be smaller than the size (width) of the electron/optical (EO) slit (i.e. the size of the complete array of beamlets as projected onto the wafer) (e.g. smaller than the maximum size of 26 mm), then more fields can be placed on the wafer, but not all of the beamlets will be used to write on each field. The EO slit will need to scan the wafer more times and the overall throughput will decrease. When a machine is writing patterns to a field, at some moment the beamlet blanker array enters the next field and starts writing patterns in it, so the machine can preferably write in two fields at the same time. If a field is sufficiently small, the machine may be designed to write 3 fields at the same time.

In a preferred embodiment of the lithography machine, the machine generates a large number of subbeams (a subbeam being a patterned beam comprising a group of beamlets) for exposing the stripes on the wafer in an exposure, there being slightly more subbeams than stripes. The beamlet blanker array preferably contains a photo diode for each subbeam and an blanker aperture for each beamlet. In this embodiment, each photo diode in the beamlet blanker array receives a multiplexed signal for control of a set of blanker elements/beamlet deflectors for control of the beamlets in the corresponding subbeam.

For example, the machine may generate 13,260 subbeams for exposing 13,000 stripes of a full field on the wafer in one or more exposures, so that there are 2% more beams than stripes. In this embodiment, each subbeam may be split into 49 beamlets, resulting in 649,740 beamlets (i.e. 13,260×49). The beamlet blanker array contains 13,260 photo diodes and 649,740 apertures in an area of approximately 26×26 mm. Each photo diode in the beamlet blanker array receives a multiplexed signal for control of 49 (7×7) blanker elements/beamlet deflectors for modulating/deflecting the 49 beamlets of one subbeam. The 13,260 subbeams over a distance of 26 mm result in a stripe of width 2 μm in the x-direction (perpendicular to the mechanical scan) and as long as the field in y-direction. Each patterned beam comprising 49 beamlets writes a single stripe on the wafer.

Channels

Figure 5:
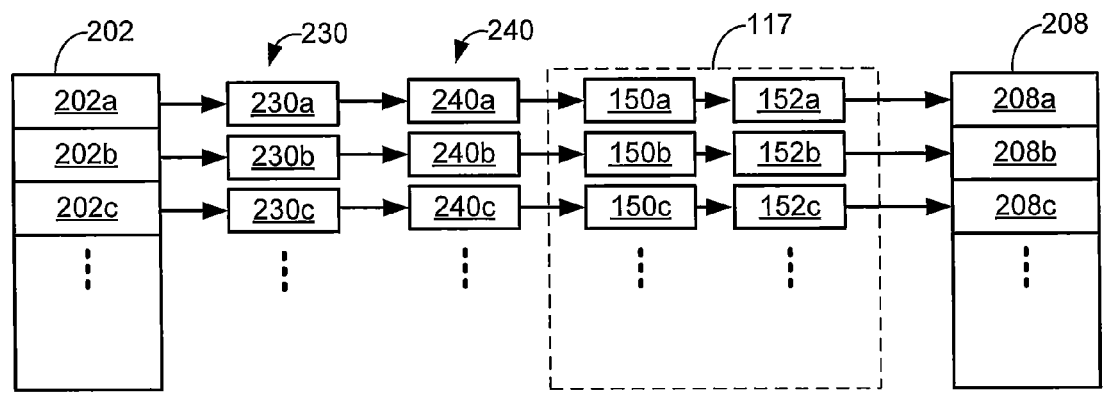
FIG. 5 is a conceptual diagram of an example of a data path comprising multiple channels.

The data path may be divided into a number of channels. A channel is a data path from a processing unit to the lithography system (and may be considered to conceptually extend all the way from a pattern data file in a preprocessing unit through the lithography machine to the exposed target). FIG. 5 shows a conceptual diagram of an example of a system comprising multiple channels. A pattern data file 202 is divided into portions 202a, 202b, etc. which relate to portions of the pattern to be exposed on the target. In one embodiment, each portion includes pattern data for a stripe of a field to be exposed on a wafer. The pattern data 202 is transmitted via pattern streamer 230 and transmission channel 240, which in this example comprise separate pattern streamers 230a, 230b, etc. and transmission channels 240a, 240b, etc. for processing portions of the pattern data and transmitting a stream of beamlet data and control signals for each portion of the pattern data.

The transmission channels 204 transmit the beamlet data and control signals to the beamlet blanker array 117 of the lithography machine. In one embodiment, the beamlet blanker array includes signal receiving elements 150a, 150b, etc. each for receiving beamlet signals from a corresponding processing and communication channel, the signal receiving elements communicating the received signals to corresponding groups of blanker elements 152a, 152b, etc. each for modulating a group of beamlets according to pattern data transmitted by a single channel. The beamlet blanker array 117 modulates beamlets according to the beamlet data signals to expose a field 208 on the target 121. In one embodiment, the beamlets modulated by each group of blanker elements 152a, 152b, etc. expose a corresponding stripe 208a, 208b, etc. of the field on the target.

In one embodiment each communication channel comprises a pattern streamer, an electrical-to-optical converter (e.g. a laser diode), and an optical fiber for transmitting optical beamlet data and control signals, and may also include an arrangement for transmission of the optical signals in free space. The optical signals are received by optical-to-electrical converters (e.g. photo diodes) 150a, 150b, etc. which convert the received optical signals into electrical signals for control of the beamlet blanker elements.

A channel may be assigned to transmit data and control signals for a single beam/patterned beam comprising a number of individual beamlets (e.g. 49 beamlets making up one patterned electron beam). One patterned beam may be used for writing a single stripe on the wafer. In this arrangement, a channel represents the data path dedicated to control of one patterned beam comprising multiple beamlets (e.g. 49 beamlets) and carrying the beamlet signals for writing one stripe according to the pattern data.

As a result of the very large number of channels and extremely high data transmission rates per channel, the cost of the data path is a major element of the overall cost of a charged particle lithography machine. Due to the very large number of channels, it is likely that a portion of the data path channels will suffer a failure or loss of fidelity and should not be used during an exposure. Furthermore, due to the very large number of beamlets that must be generated and precisely controlled in the lithography machine, it is likely that a portion of the beamlets will suffer a failure or become out-of-specification and should not be used during an exposure. To cope with the failure of channels the data path should include spare channels, and to cope with the failure of beamlets, the data path should include a means to reallocate channels to beamlets to ensure that the entire wafer can be exposed by properly functioning beamlets.

The data path preferably provides additional capacity to provide redundancy for failed channels, by including enough channels to transmit pattern data for exposure of the wafer plus an additional number of channels available as spare or redundant channels. This allows the use of spare transmission channels and/or spare blanker receiver circuitry (e.g. photodiodes) to compensate for failed channels between the processing system and the beamlet blanker array and/or compensate for <100% yield of beamlet blanker circuitry. This design also allows the testing of spare channels while exposures are simultaneously taking place, and with only a small amount of extra test circuitry since this can be switched to any channel.

The data path preferably also provides facilities for providing redundancy for failed or out-of-specification beamlets. This can be achieved using a two-pass (or multi-pass) scan strategy, in which a first scan of the wafer writes a portion of the field stripes and a second scan writes the remaining portion of the stripes, to result in writing all of the stripes of each field of the wafer over the two scans. A dual-scan exposure approach (i.e. a primary-scan/redundancy-scan) is preferably implemented by splitting the active channels per scan approximately 50%/50%. This provides several benefits. It results in a smoothing out of the wafer heating effect because each scan of a dual-scan exposure involves fewer and approximately the same number of beams. The maximum power consumption is reduced and there is less variation in the power consumption of the system due to a more even division of power consumption over the two scans. Also less processing resources are needed, particularly real-time processing resources, for processing the pattern data to prepare for transmission to the lithography machine, because the processing is split more evenly between the primary and secondary scans. This reduces cost, reduces the footprint of the pattern data processing systems, saves expensive fab floor space, and reduces power consumed by the processing systems. This design also reduces the number of optical transmission components in the data path by sharing them over primary and secondary scans, saving on component cost, complexity and maintenance cost, and reducing the power and area consumed by the optical-to-electrical converters and associated circuitry on the blanker array.

The strategy to balance the number of active channels over primary and secondary scans and obtain these advantages may be implemented with the addition of a "switch matrix" (e.g. switches 400 and 420 shown in FIG. 6B), to switch processing and/or transmission resources to the active beams for each scan.

Figure 6A:
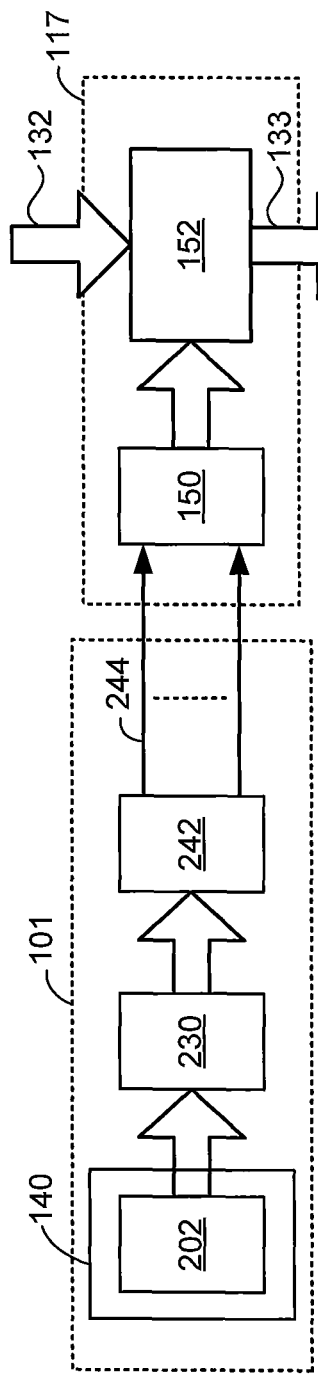
FIG. 6A is a schematic diagram showing a data path including a pattern streamer and blanker array.

FIG. 6A is a simplified schematic diagram showing a data path 101 and blanker array 117. The data path 101 comprises processing system 140 with a hard disk storage for storing pattern data 202, which is transmitted to pattern streamer 230 and then streamed to electrical-to-optical (E/O) conversion devices 242 to generate optical signals for transmission over transmission channels 244 comprising optical fibers. The optical signals are received by optical-to-electrical (O/E) conversion devices 150 which generate corresponding electrical signals which are transmitted to beamlet blanker electrodes 152 for modulation of the beamlets 132.

Figure 6B:
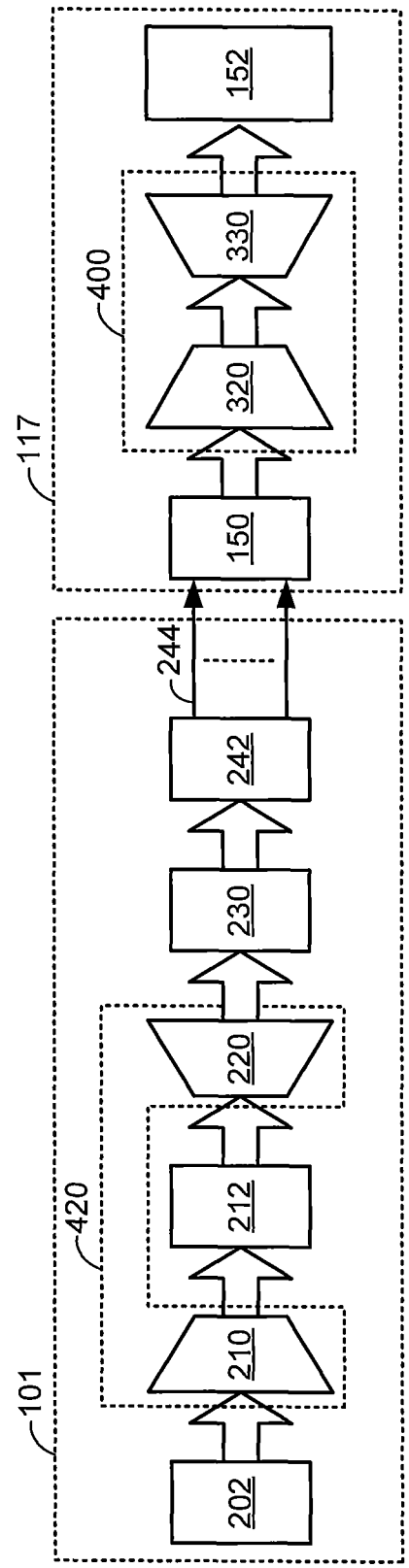
FIG. 6B is a schematic diagram of the data path of FIG. 6A and also including switch matrices for implementing redundant channels in the data path and providing redundancy for beamlets.

FIG. 6B is a simplified schematic diagram showing the same system including switch matrices 400 and 420 for implementing redundant (spare) channels in the data path and to provide redundancy for failed or out-of-specification beamlets.

The pattern data 202 from the hard disk first passes through a first primary/secondary beam selector 210 which selects a portion of the pattern data for the particular scan being performed, e.g. either the first (primary) scan or second (secondary or redundant) scan. The pattern data selected by the first primary/secondary beam selector 210 is loaded into memory 212, and then passes through first channel selector 220, which selects which channels to use for transmitting the pattern data. The pattern data is transmitted over the selected channels to E/O devices 242 which generate optical signals for transmission over optical fibers 244. The optical signals are received by O/E devices 150 which generate corresponding electrical data/control signals which pass through a second channel selector 320 and a second primary/secondary beam selector 330, and are transmitted to beamlet blanker elements 152 for modulation of the beamlets.

The two channel selectors 220 and 320 operate in conjunction with each other to select which channels to use for transmission of pattern data for a particular scan. The selectors operate to select a spare channel in place of a failed channel to implement a channel redundancy scheme.

The two primary/secondary beam selectors 210 and 330 operate in conjunction with each other to select a portion of the pattern data 202 to be transmitted to selected beamlet blanker elements. This enables a matching of the beams used in each scan and the pattern data for the stripes on the wafer to be exposed by those beams. The blanker elements which modulate or switch the beamlets of a beam must have the correct pattern data transmitted to them, corresponding to the stripes on the wafer to be exposed by the beam. This matching of pattern data and beams enables a multi-pass scan and provides a redundancy mechanism to address failure of beamlets.

The first primary/secondary beam selector 210 and first channel selector 220 form a first switch matrix 420, and the second channel selector 320 and second primary/secondary beam selector 330 form a second switch matrix 400. To obtain the maximum number of advantages, the switch matrix 420 can best be implemented before the processing resources of the pattern streamer 230, and switch matrix 400 after the optical transmission receivers 150 at the blanker array 117. Implementation of the switch matrix 400 at the blanker array side results in a reduction of resources required at the pattern streamer 230 and optical fibers 244. The switch matrix 400 is preferably located on the blanker array 117 so that it is in close proximity to the beamlet blanker elements 152 which deflect the beamlets.

Figure 7:
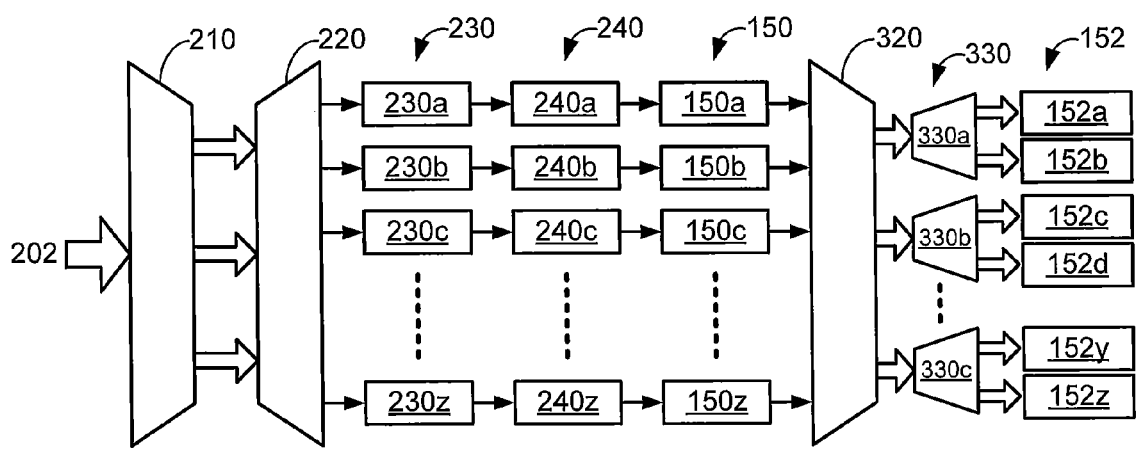
FIG. 7 is a block diagram of a data path arrangement with redundant paths.

FIG. 7 is a block diagram of a data path arrangement with redundant paths comprising a first beam selector 210, first channel selector 220, pattern streamer 230, transmission system 240, signal receivers 150, second channel selector 320, second beam selector 330, and beamlet blanker elements 152. Pattern data 202 typically resides on disk in a data file in an offline system 104 but may also be stored on other media and/or in a realtime system or part of the lithography tool. The pattern data file comprises pattern data for a large number of channels for control of large number of electron beams.

Data Path Redundancy

The embodiment shown in FIG. 7 includes additional capacity in the data path to provide for redundancy. The channel selectors 220 and 320 provide for this redundancy by connecting to selected channels provided by the pattern streamer 230, transmission system 240, and signal receiver 150. The pattern streamer 230, transmission system 240, and signal receiver 150 preferably provide enough channels to transmit pattern data for each scan of the wafer or for each pass of a multi-pass scan of the wafer, plus an additional number of channels available as spare or redundant channels.

Figure 9:
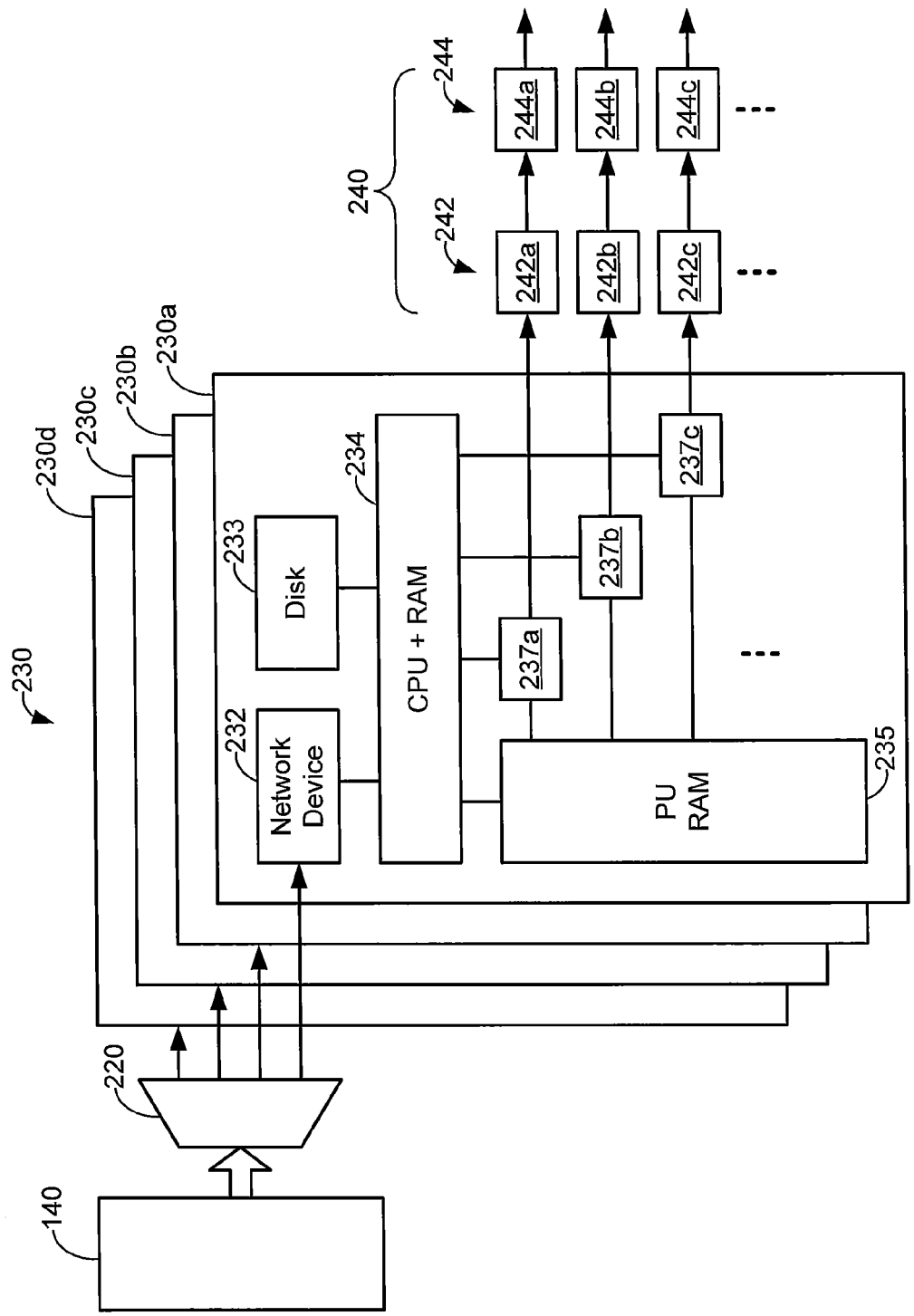
FIG. 9 is a simplified block diagram of a pattern streamer.

The pattern streamer 230 comprises multiple pattern streamers 230a, 230b, etc. which each provide for processing a portion of the pattern data for one channel to generate a streamed beam data/control signal. An embodiment of a pattern streamer is shown in FIG. 9 and described in more detail below.

The transmission system 240 comprises multiple transmission elements 240a, 240b, etc. each for transmission of beam data/control signals for one channel of the data path. The transmission elements comprise the components for transmitting the beam signals from the pattern streamers to the blanker of the lithography machine. The transmission elements may provide for transmission of electronic signals, or conversion from electrical to optical signals and transmission of the optical signals. In one arrangement, the transmission elements comprise electro-optical conversion devices and optical fibers, e.g. as described above in connection with FIG. 3.

The signal receiver 150 comprises multiple receivers 150a, 105b, etc. In one arrangement the receivers comprise optical-to-electrical conversion devices for receiving an optical signal and converting it back to an electrical signal, e.g. as described above in connection with FIG. 3. The signal receivers are preferably located on the blanker so that the beam data/control signals can be conveniently transferred to the individual beam blanker electrodes to modulate or switch the individual beamlets. An individual pattern streamer 230a, transmission element 240a, and signal receiver 150a, may be arranged as shown in FIG. 7 to form a single channel of the data path for processing and transmission of data/control signals for a single beam (or patterned beam). In case of a failure of one or more of the components in a channel, the channel selectors 220 and 320 can be used to avoid using the failed channel by selecting an alternative channel.

To deal with a certain number of failed transmission channels (mainly due to the channel yield of the blanker chip not being 100%), extra channels are needed. For example, in an embodiment designed to expose 13,000 stripes on a wafer using 13,260 patterned beams in two scans, each stripe being exposed by one patterned beam receiving data/control signals from one channel, the number of channels needed in the data path may be calculated as approximately one half of the 13,260 active channels (for the complete exposure) plus a certain number of spare channels. For example, this may comprise 7/13 of 13,260, i.e. 7140 active channels, with approximately 9% spare channels (i.e. 9% of 7140) equals approximately 7800 channels.

The use of the primary/secondary beam selectors 210 and 330 enables a reduction of overall number of channels, in the above example from 13,260 to approximately 7800. The channel selectors 220 and 320 enable selection among the pool of channels which permits an initial lower yield for the components of the channels (including photo diodes) to be tolerated and allowing for channels becoming out-of-specification in manufacture or during operation, resulting in less stringent manufacturing requirements and a lower MTBR (Mean Time Between Repair) for the data path. The switch matrixes also allow for on-line monitoring of channel performance by means of a shared transmission bit error checker.

The switch matrixes result in a small increase of silicon area for the circuitry and power consumption, but since the circuitry involved is mostly static, the power consumption increase is small. Additional control circuitry is also required of the switch matrix.

For a system yield (i.e. total channels operational) of 98% or greater, and a channel yield of 96% (i.e. maximum of 4% of channels defective) and a group (cluster) size of 357 optical channels, it is calculated that 9.2% extra channels are needed in one embodiment with 33 extra optical channels per cluster, the cluster comprising a total of 390 channels with 357 active channels. In one embodiment, the 357 channels are divided into 51 units of 7 channels each, each 7 channels for controlling 7 subbeams out of a row of 13 consecutive subbeams in the EO slit matrix.

Multi-Pass Scan

The embodiment shown in FIG. 7 also provides for a multi-pass scan strategy, in which a first scan of the wafer writes a portion of the field stripes and a second scan writes the remaining portion of the stripes, to result in writing all of the stripes of each field of the wafer. This principal can also be extended to three scans or four scans etc., although a greater number of scans increases the total time for exposing the wafer and reduces wafer throughput. Thus, a two-pass scan (also referred to as dual scan) approach is preferred. A multi-pass scan inevitably reduces throughput, but is performed in order to ensure that only properly functioning beams are used for the exposure so that no stripes or areas of the wafer which should be exposed are left unexposed or improperly exposed. Even one missed/unexposed stripe within a field typically renders that field of the wafer useless, and thus a two-pass scan is preferred.

A multi-pass scan can be used to compensate for failed, misaligned, or otherwise out-of-specification beamlets (referred to generally as a failed beamlet). Where the lithography machine generates and modulates a very large number of beamlets, it a greatly preferred to avoid the necessity of including an additional system within the machine for manipulating the path of individual beamlets or groups of beamlets to reallocate functioning beamlets into writing positions occupied by failed beamlets. A multi-pass scan strategy avoids this, the beamlets being reallocated by moving the wafer to a different position during a second (or subsequent) scan.

The failure rate of beamlets is typically low making a two-pass scan feasible for this purpose. To extend the time between maintenance of the system as much as possible, a check may be performed periodically to identify failing beamlets. This check may be performed before each wafer scan, before each first scan of a wafer, or at some other convenient moments. The check may include one or more beam measurements, including for example as described in co-pending U.S. application 61/122,591, which is hereby incorporated by reference in its entirety.

Where a failed beamlet is detected, the affected beamlet may be switched off so that the area (stripe) that would have been exposed by that beamlet is not written. A second scan is then used to write the wafer stripe that was omitted during the first scan. In a patterned-beamlet system such as described above which uses one channel to transmit data/control signals for one patterned beam comprising multiple beamlets, the complete channel that includes the failed beamlet is preferably switched off, and the complete stripe of the wafer field that would have been exposed by the beamlets of that channel will not be written. After performing a first scan of the entire wafer, a second scan may then be performed to fill in the missing stripe (and any other missing stripes for other channels with failed beamlets) using a functioning channel which has all its beamlets operating in-spec.

For the second scan the wafer may be returned to the starting position after the first scan, but it may also be shifted to a position which ensures that properly functioning channels are available for writing the missing stripes. For the second (redundancy) scan of a dual-scan exposure, the pattern data is preferably prepared (i.e. processed to convert the pattern data into a format suitable for transmitting to the blanker) in the lithography system during the first scan to enable the second scan to begin as soon as possible after completion of the first scan. There is preferably no significant delay between the end of the first scan and the start of the second scan, so data for the second scan is preferably available quickly on the appropriate node. The lithography machine is preferably able to write successive in-line fields in one scan, and write in both directions in a y-direction parallel with the mechanical scan, i.e. both +y-direction and −y-directions. The machine also preferably includes spare beams (or spare patterned beams comprising multiple beamlets), usually located at the edges of the column, although this is not necessary to implement the dual scan strategy.

In order to write the missing stripes during the second scan by properly functioning channels, the wafer may be shifted (offset) with respect to the column of the lithography machine in the +x-direction or −x-direction, in an amount corresponding to a number of stripes, until channels with properly functioning beamlets are positioned to write the missing stripe positions. This is preferably accomplished, at least in part, by a mechanical offset of the wafer on the stage. To deal better with all kinds of error positions (e.g. failure of both the first and last channel), an offset of the wafer for both the first and second scans may be desirable.

FIG. 4C shows a possible of arrangement of subbeams 514 for exposing a wafer field, and FIG. 4D illustrates the effect of failed subbeams 516. The subbeams projected into a line 518 in the x-direction has gaps 520 corresponding to the failed subbeams. As the wafer is moved in the y-direction during a first scan, the stripes falling under the gaps 520 will not be written. The wafer can be shifted slightly in the x-direction so that functioning subbeams are aligned with the stripes that were not written in the first pass. A second pass can then be performed, so that the stripes missed on the first pass are now written by functioning subbeams.

Figure 4E:
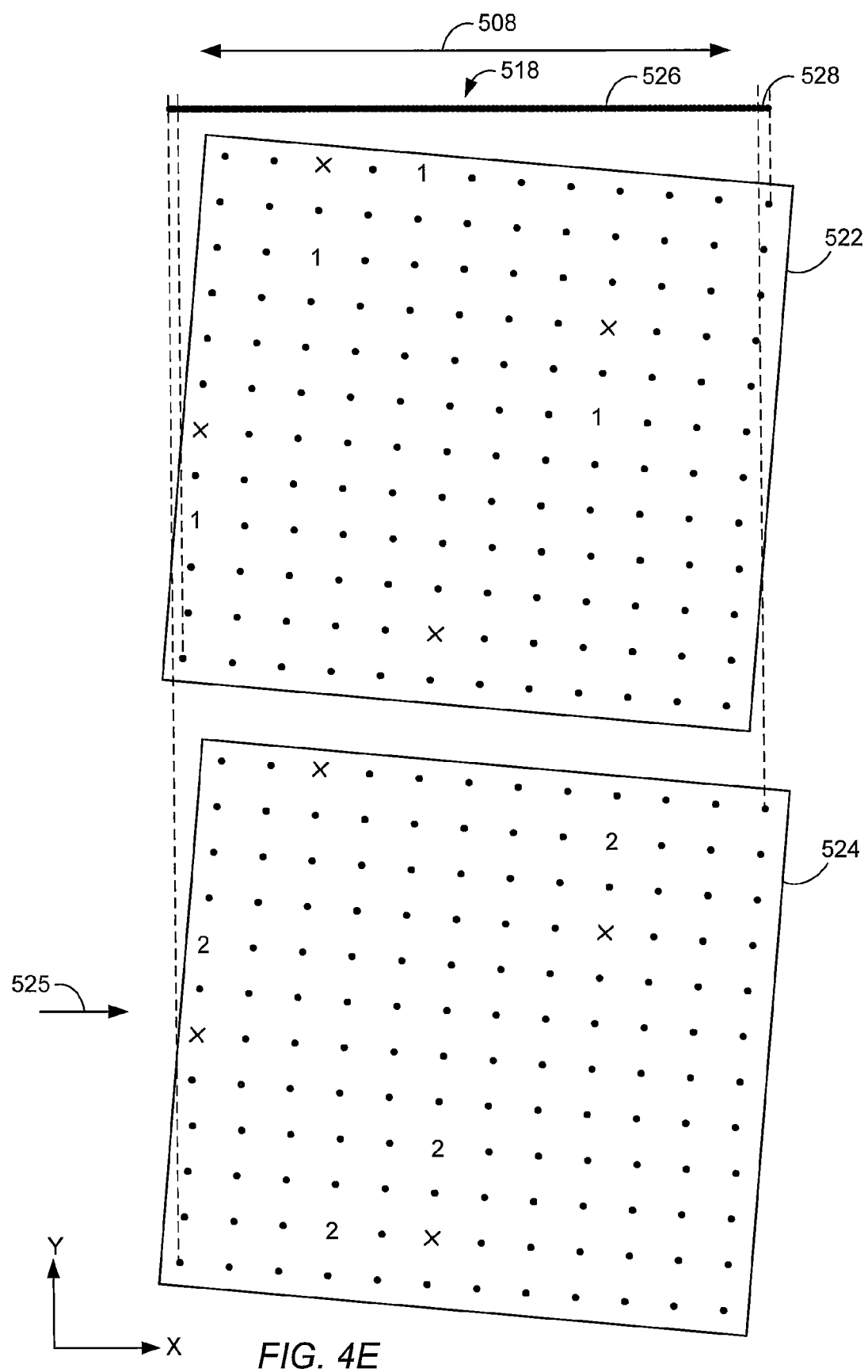
FIG. 4E is an illustration of a two-scan exposure including a beam array shift.

FIG. 4E shows an array of subbeams 522 for a first scan with failed subbeams (indicated by an "X") and the same array shifted two positions 524 for a second scan. The subbeams in array 522 corresponding to the failed subbeams in array 524 are indicated by a "1" and the subbeams at these positions must be written during the first scan (because none of the subbeams of array 524 can write in these positions). Similarly, the subbeams in array 524 corresponding to the failed subbeams in array 522 are indicated by a "2" and the subbeams at these positions must be written during the second scan. The other subbeam positions (indicated by a dot) may be written by either the array 522 in the first scan or array 524 in the second scan. As discussed above, to reduce the size of the data path, the allocation of active subbeams to each scan may be made so that approximately half of the subbeam positions are written during each scan. The subbeam array 524 is illustrated as being shifted in FIG. 4E, but in practice it is usual to shift the wafer. Due to this shift, the subbeams projected onto line 518 in the x-direction has no gaps because all of the positions corresponding to a failed subbeam can be written by a functioning subbeams during one of the scans. On line 518 there is a central overlapping region 526 which may be written during either scan, and an "extension" at either end which may be written during only one of the scans. To increase the probability that a functioning subbeam is always available to write each in position during one of the scans, the overlapping region 526 is larger than width 508 of the field. The size of the extension at both ends of the subbeam array width, i.e. slit width, has a direct relation to the probability of finding a functioning subbeam to write in every position across the width of the field over the preferred maximum of two scans, so that no stripes are missed. The larger the extension the higher the probability to successfully find a match of functioning subbeams to writing positions that allows writing a field without missing lines, at the maximum expected beam failure rate. The larger the amount of subbeam failures, the smaller the chance of finding a successful match within a reasonable time, up to the point that it becomes impossible at all to find such a match.

Various algorithms may be used to calculate the channels to be used for the first and second scans and the wafer offset required for each scan, to result in all stripes being written by functioning channels. For a two-pass scan, the algorithm looks for an approximate 50/50 split of channels between each scan that does not use any failed channels. A "brute force" approach could be used to test various channel allocations and wafer offsets to find a suitable combination, or more sophisticated matching beam selector algorithms could be used.

For a lithography system using a two-pass scan, the number of subbeams/beamlets may also be reduced. In principle, the requirement is to provide a functioning beam at every writing position across the width of a field for at least one of the two passes (e.g. 13,000 subbeams at a 2 micron pitch over the 26 mm width of a field). This is illustrated in FIG. 4D, where every position along the line 518 requires a functioning subbeam in one of the exposure scans in order to correctly expose the field across its entire width in two scans. In theory it is possible to achieve this with a lithography machine having less beams than the number of writing positions across the field width (e.g. with less than 13,000 subbeams). However, to achieve this in practice, a preferred embodiment includes slightly more subbeams than writing positions across the field. This results in at least one alternate subbeam at each writing position across the field width. In this arrangement, the subbeam array width 509 will be slightly more than the field width 508, with a small extension at both ends, so that a shift of the wafer for the second pass still results in the central overlapping section 526 covering the full width 508 of the field to be exposed. The emphasis in the design is in raising the probability that a field will be written correctly, i.e. by writing all stripes in the field with properly functioning subbeams/beamlets, given a certain allowed or expected number of beam failures in the system, e.g. a maximum expected failure rate of 2%. Exposing the field in two passes reduces the throughput of the lithography machine and should be avoided where possible.

In one embodiment having 2% more subbeams than stripes, e.g. 13,260 subbeams for exposing 13,000 stripes, the match between subbeams and stripes can be shifted at most 260 stripes between the groups of 13,000 consecutive subbeams available for the first and second scans. From these two groups of 13,000 consecutive subbeams, the subbeams actually selected for writing the stripes will later be selected. To evaluate all possible matches, the matching algorithm would evaluate 260×260=67,600 possible combinations to find two suitable groups of subbeams for writing the 13,000 stripes in two passes. Because the groups of subbeams selected in the first and second pass are interchangeable, this reduces the number of combinations by about half, to 33,930. Furthermore, the calculation can be parallelized since testing the suitability of each combination of groups of subbeams in the first and second pass can be done independently.

In one embodiment, the beam selector algorithm is written to loop through all possible combinations of two groups of 13,000 subbeams. Each time, a function is called to determine which subbeam can write which stripe in each pass. In this function, for each stripe (1-13,000) it is determined which subbeam can write the stripe in the first pass and the second pass. If a stripe can be written by only one subbeam in either the first or second pass, that subbeam is assigned to write the stripe in the relevant pass. If no subbeams can be found to write a stripe, the function exits and a new combination of two groups of 13,000 subbeams is evaluated. If two different subbeams can write a stripe, no subbeam is assigned yet to write it.

In the next step, the actual assignment is performed of which subbeam in which pass will write which stripe. This function determines for all stripes if it is written in the first or second pass and by which subbeam. This function may alternate between first and second pass in assigning consecutive stripes to a subbeam number.

Note that in both functions, a record for the first and second pass is maintained of the number of subbeams that will write a stripe in each row of 13 subbeams in a beam area of the EO slit. Each row of 13 beams in the EO slit is assigned to a group number, to ensure that not more than 7 subbeams will be selected for a pass out of a row of 13 subbeams in the EO slit.

Besides the ability to compensate for failed beamlets, a multi-pass scan also has the advantage that the total exposure current for the wafer is divided between two (or more) scans, reducing the instantaneous heating of the wafer and smoothing out the heat load on the wafer over multiple scans. Using multiple scans also reduces the required capacity in the data path. When using two scans for each wafer, the data transmission capacity of the data path is theoretically halved, because each scan only requires half of the amount of beamlet control data. This reduction in required capacity is significant because of the enormous data transmission capacity required and the associated high cost of the data path. For example, for a lithography machine with 49 beamlets per patterned beam comprising one channel, a transmission capacity of approximately 4 Gbit/sec per channel may be expected. A lithography machine with 13,260 patterned beams each with 49 beamlets would require 13,260 channels each of 4 Gbit/sec capacity. Thus, reducing the required capacity for the data path is significant. For these reasons, a multi-pass scan is advantageous even in the absence of any failed or misaligned beamlets.

The beam selectors 210 and 330 may be used to implement a multi-pass scan strategy in the data path. The first beam selector 210 selects a portion of the pattern data file for transmission via the data path to the lithography machine during each scan of the wafer, and the second beam selector 330 routes the transmitted beam data/control signals to the beamlet blanker elements corresponding to the patterned beams selected for use during the scan, for modulation of the appropriate beamlets. For example, for a two-pass scan of a wafer, a first portion of the pattern data corresponding to a first portion of the exposure fields on the wafer is selected for transmission during a first scan, and the remaining portion of the pattern data corresponding to the remaining unexposed fields on the wafer is selected for transmission during the second scan. For the first scan, the beam selector 210 routes the first portion of the pattern data to the pattern streamer 230 for transmission to the lithography machine. The spare channel selector 320 routes beam data/control signals from the signal receiver 150 to the relevant beamlet blanker elements belonging to the patterned beams selected for the first scan. For the second scan, the beam selector 210 and pattern streamer 230 similarly route the remaining portion of the pattern data for transmission to the relevant beamlet blanker elements belonging to the patterned beams selected for the second scan. In a two-pass scan, it is preferred that approximately half of the pattern data is transmitted during each pass to minimize the required capacity (e.g. number of channels) of the data path. A three-pass or other multi-pass scan strategy may also be implemented in a corresponding fashion, with the pattern data preferably being transmitted in approximately equal portions during each scan.

The beam selector 210 and the spare channel selector 320 may be implemented as hardware, software, or a combination of hardware and software. The beam selector 210 may comprise a system for addressing selected locations in the pattern data file 202, e.g. for addressing portions 202a, 202b, etc. of the pattern data file which include pattern data for exposure of selected stripes of a field on a wafer. The spare channel selector 320 and beam selector 330 are described in further detail below.

Thus, the arrangement of FIG. 7 provides for two methods to achieve redundancy in the lithography system. The set of channels and channel selectors 220 and 320 provide for redundancy in the transmission of beam data/control signals to the lithography machine. In the embodiment of FIG. 7, the data path includes redundant pattern streamers 230 to also provide for redundancy in the generation of the beam signals. The beam selectors 210 and 330 also provide for multi-pass scans to provide redundancy for failed beamlets.

In one embodiment of a lithography system, 13,260 patterned beams are used to write 13,000 stripes on the wafer, where each patterned beam comprises 49 beamlets, and the pattern data provides 13,260 channels of data for control of 649,740 individual beamlets. The pattern data is provided in a data file 202 of an offline system 104. In one embodiment, the data path includes transmission capacity for 7800 channels in the pattern streamer 230, transmission system 240, and signal receiver 150. The 7800 channels are conceptually arranged in 20 clusters, each cluster comprising 357 channels divided into 51 units of 7 channels each and 33 additional channels. The pattern data for 13 channels (e.g. the pattern data corresponding to 13 stripes to be exposed on a wafer) corresponds to 13 patterned beams of the lithography machine (for writing the 13 stripes on the wafer). The beam selector 210 provides for selection of pattern data for 7 channels from the pattern data for 13 channels, and the beam selector 330 provides for switching of 7 transmission channels to the blanker elements for 7 of the 13 beams of the lithography machine corresponding to the transmitted pattern data.

In a first scan of a two-pass scan of a wafer, 7140 channels of pattern data are transmitted, i.e. about 54% of the total number of channels represented in the pattern data. The channel selectors 220 and 320 operate complementarily to select 357 of the 390 channels available in each cluster in each of the 20 clusters, thus selecting 7140 channels out of the total 7800 channels available. For each of the 20 clusters, if any of the selected working channels in the 51 units of the cluster have failed, one of the 33 non-selected additional channels of the cluster is used instead. Alternatively, if one or more channels in a unit as failed, the entire unit is deselected and 7 channels from the 33 spare channels of the cluster are used instead. Many other substitution methods may also be used to select spare channels to replace failed channels. In the second scan of a wafer, the remaining 6120 channels of pattern data are transmitted. The channel selectors 220 and 320 operate complementarily to select 306 of the 390 channels available in each cluster in each of the 20 clusters, thus selecting 6120 channels out of the total 7800 channels available. For each of the 20 clusters, if any of the channels have failed, one of the non-selected additional channels is used instead as described above. Table 1 below summarizes the use of channels for this embodiment. Of course, many other arrangements of the pattern data into channels, allocation of channels into groups, distribution of spare channels, and allocation of channels for each scan may be contemplated using the principles described herein.

TABLE 1

|  | Per cluster | Total |
| --- | --- | --- |
| Data path clusters | 1 | 20 |
| Active channels | 357 | 7,140 |
| Additional channels | 33 | 660 |
| Total channels | 390 | 7,800 |
| Channels to be transmitted |  | 13,260 |
| Channels transmitted in first scan | 357 | 7,140 |
| Channels transmitted in second scan | 306 | 6,120 |
| Subbeams (patterned beams) |  | 13,260 |
| Beamlets (49 per subbeam) |  | 649,740 |

Figure 8A:
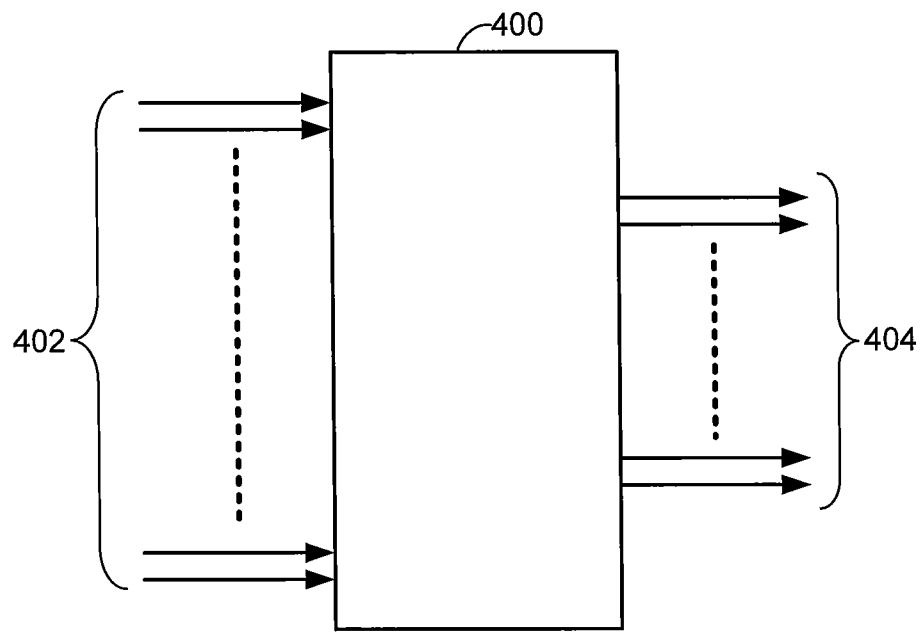
FIG. 8A is a block diagram of a data path arrangement comprising a switch for redundant path selection.

FIG. 8A is a schematic diagram of a switch 400 for a data path arrangement with redundant paths. In this example the channels of the data path are arranged in clusters. A switch 400 receives N channels 402 in a cluster with a yield of X %. Among the channels 402 are a certain proportion of failed channels. The switch connects functioning channels from among the N channels to output M channels 404 with a yield of 100%.

Figure 8B:
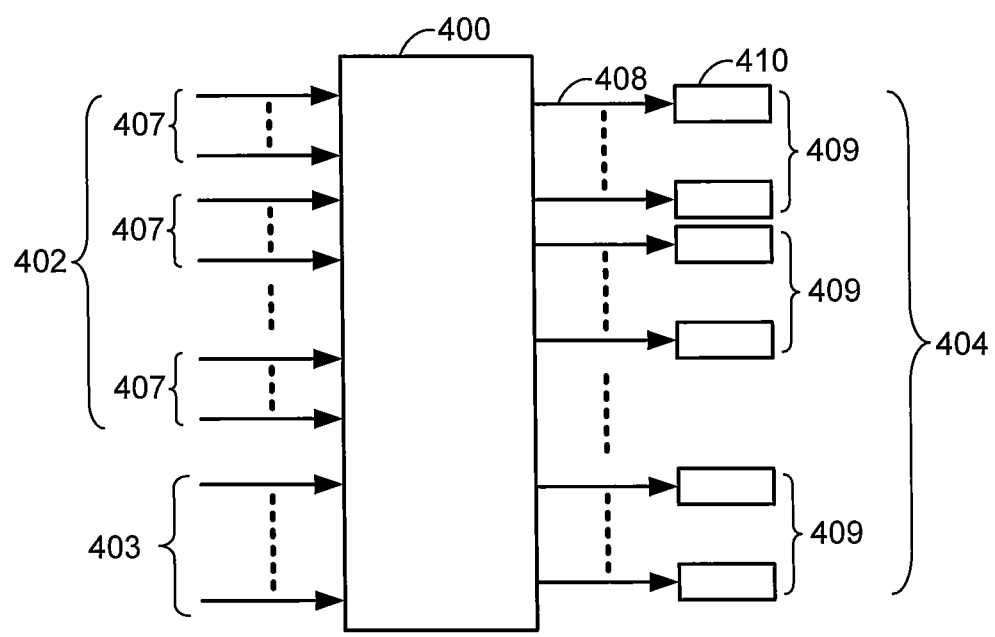
FIG. 8B is a block diagram of the data path of FIG. 8A with channels arranged in clusters.

FIG. 8B shows the N channels 402 of a cluster divided into units 407, each unit comprising, e.g. 7 channels. The switch 400 switches a unit of the selected "active" channels 402, and one or more additional channels 403 if needed to replace a failed channel 402, to the outputs 408 for input to a corresponding unit of the blanker array, each unit of the blanker array comprising, e.g. 13 channels for control of 13 patterned beams. Each output 408 from the switch 400 is sent to a deflector matrix 410 comprising a matrix of blanker elements for modulating the individual beamlets of a patterned beam.

FIG. 9 shows a simplified schematic diagram of a pattern streamer 230 and associated components. The data path transforms the pattern data, typically in the form of a GDS-II or similar data file, into on/off signals for controlling the electron beamlets of a lithography machine. This transformation may be performed in a processing system 140, typically an offline processing and central storage unit performing a series of transformations on the pattern data. This process typically includes flattening/preprocessing, rasterization, and multiplexing steps. A description of typical steps follows. The flattening/preprocessing step transforms the layout data format into a dose map. The dose map describes areas on the wafer in vector format and associated dose rate values. This step may include some preprocessing such as proximity effect correction and resist heating correction. Because of the complexity of the preprocessing, this step is preferably performed offline. The rasterization step transforms the dose map into a stream of control (on/off) signals. The multiplexing step packages the beamlet data and control signals according to a multiplexing scheme.

Each pattern streamer node 230*a*, 230*b*, etc. typically comprises a network device 232, disk storage unit 233, node processor unit 234, memory 235, and multiple channel processing units 237*a*, 237*b*, etc. For each pattern streamer node, network device 232 functions to connect the node to the channel selector 220 to receive pattern data from offline system 104 for streaming to the blanker of the lithography machine. The network device 232 communicates the pattern data to node processor unit 234 for conversion of the pattern data into beam data and control signals for streaming to the lithography machine blanker. Disk storage unit 233 provides for storage of the pattern data during the conversion process. The beam signals generated by the node processor unit are stored temporarily in memory 235 from which the signals are streamed by the channel processing units 237*a*, 237*b*, etc.

In this embodiment the pattern streamer node supports several channels, and includes for each channel a channel processing unit 237*a*, 237*b*, etc. In this embodiment, electro-optical conversion devices 242*a*, 242*b*, etc. receive the streamed beam data/control signals from the channel processing units and convert these electrical signals to optical signals for transmission over fiber optic cables 244*a*, 244*b*, etc. The pattern streamer node may be conveniently designed to service 12 channels to match commercially available electro-optical converters with 12 separate converters in one package. For the embodiment described above with the data path arranged in clusters, each pattern streamer node may be arranged to stream data for a single channel of each of 12 units of a cluster.

Figure 10:
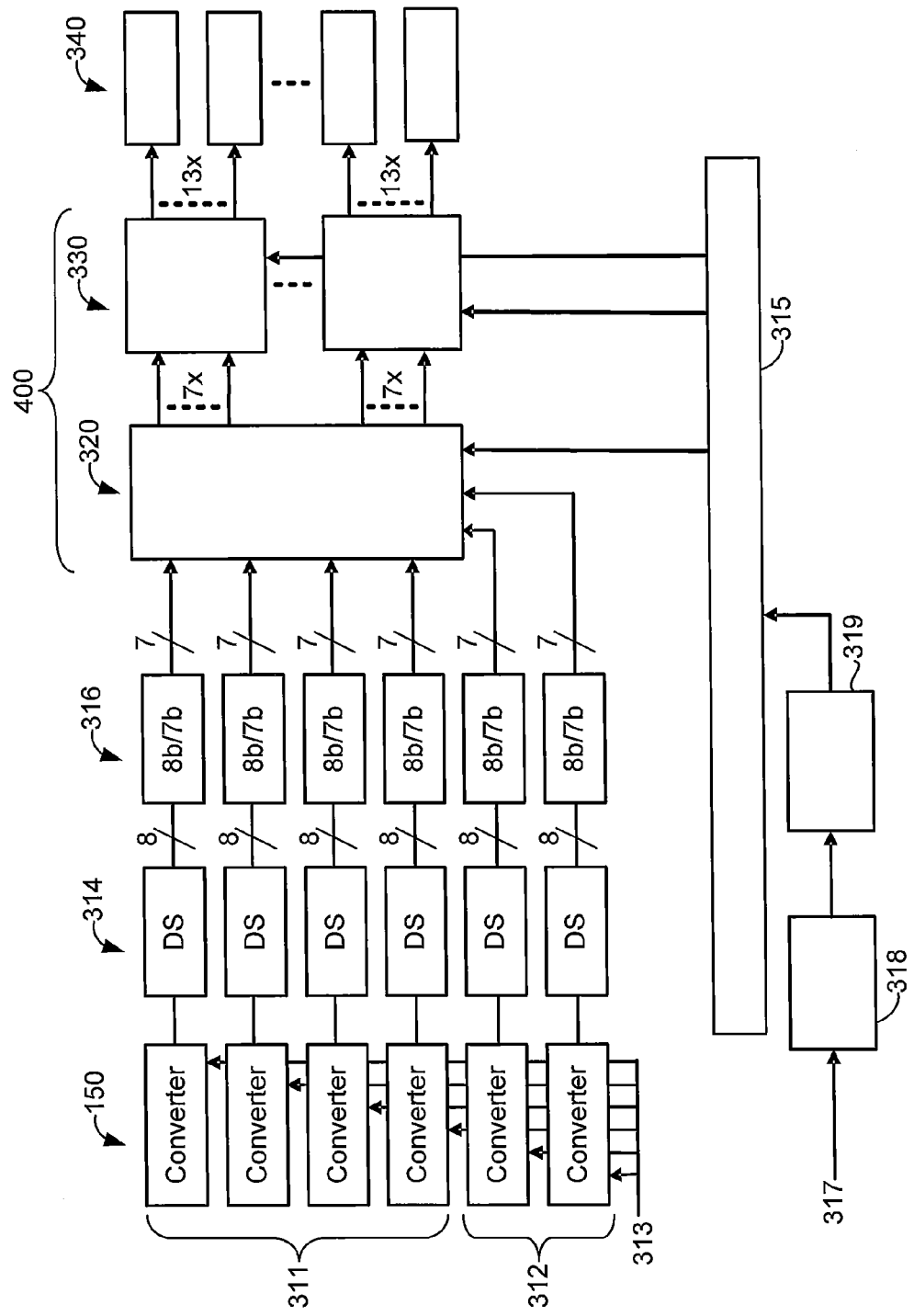
FIG. 10 is a simplified block diagram of signal receiving, switching and demultiplexing circuitry for a beamlet blanker array.

FIG. 10 shows a simplified diagram of one embodiment of signal receiving, switching and demultiplexing circuitry for a data path. These elements are preferably fabricated on the blanker array so that the receivers for receiving the optical beam data/control signals and the circuits for subsequently processing the signals and for controlling the individual beamlet blanker elements are all in close proximity. This is accomplished in one embodiment with the blanker array apertures formed in a silicon substrate, and the blanker electrodes, optical-to-electrical converters, switches, and associated circuitry formed on the substrate using conventional lithography and semiconductor processing techniques.

The signal receivers 150 comprise optical-to-electrical conversion devices (e.g. photodiodes) for receiving the optical beam data/control signals, and converting the signals back to electrical signals. In the embodiment described above the data path is arranged in clusters, each cluster comprising 390 channels divided into 51 units of 7 channels each and 33 additional channels as indicated in FIG. 10 (although fewer channels are shown for clarity). Each signal receiver 150 receives an optical signal modulated to represent a serial data/control signal for each subbeam (e.g. comprising signals to control 49 beamlets in a single subbeam) and also receives a reference clock signal 313 for indicating the timing when the signals should be read, as described in more detail below. A deserializer 314 receives each serial output signal from the signal receivers 150 and converts it to an 8-bit encoded signal. A 8-bit/7-bit decoder receives each 8-bit encoded signal and decodes it into a 7-bit data signal containing data for control of 7 beamlets. Additional bits for control signals may also be present, e.g. sync and clock signals for synchronizing operation of the beamlet deflectors and associated circuits.

The second channel selector 320 has 390 inputs and 357 outputs, and receives the beam data and control signals for all 390 channels in a cluster. Under the control of the switch control unit 315, the channel selector 320 connects 357 out of the 390 inputs to its 357 outputs (each input and output comprising a set of parallel signals comprising the data bits for control signals for control of a set of beamlets), so that any defective channels are not used and 100% of the 357 channels connected to the outputs are functioning channels. The first channel selector 220 operates in a similar way, having 357 inputs and 390 outputs, the inputs being connected to the same 357 channels out of the 390 possible. The first and second channel selectors are coordinated to select 357 functioning channels for a cluster so that 100% of the channels for each cluster are functioning channels.

Figure 12:
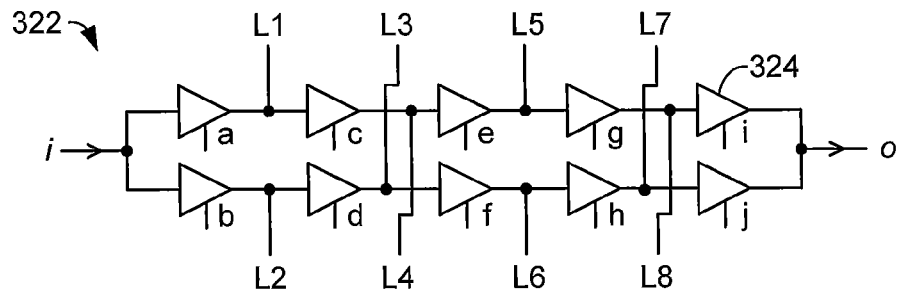
FIG. 12 is a simplified circuit diagram of a switching circuit.
Figure 13:
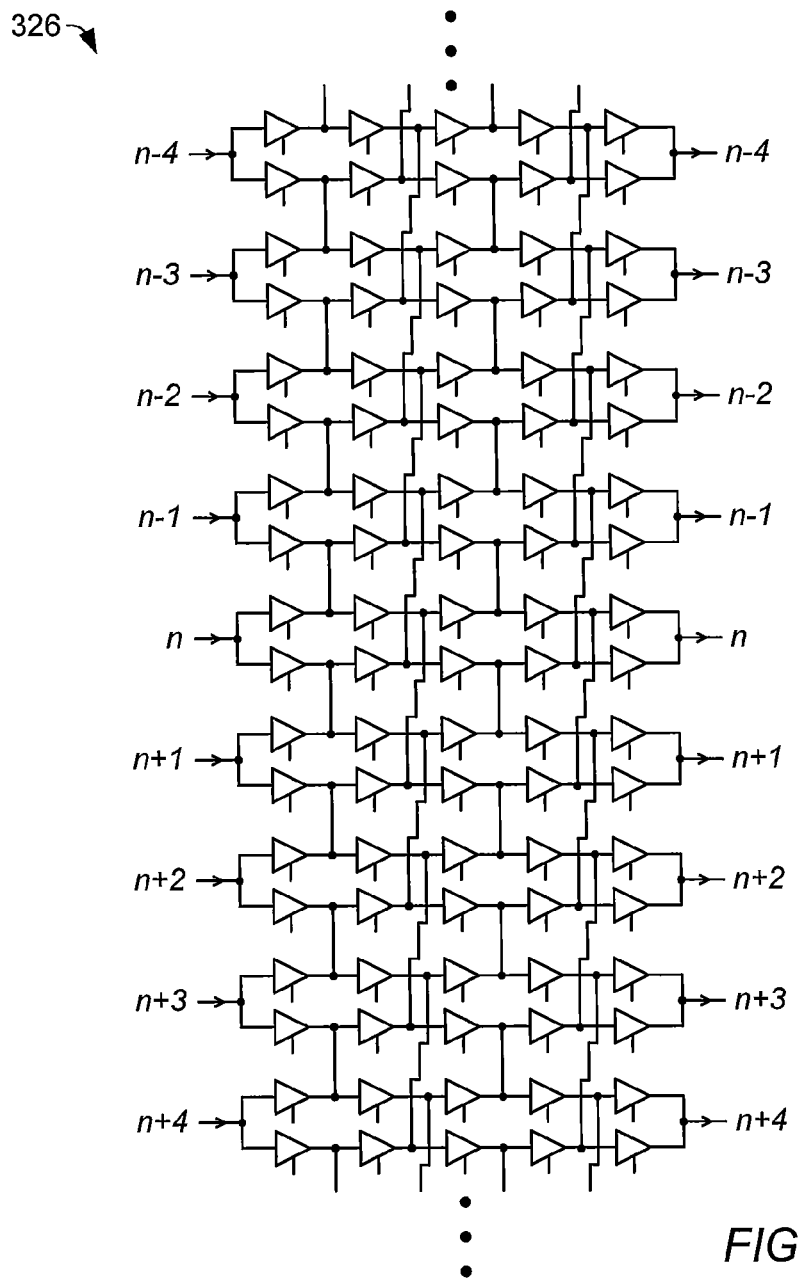
FIG. 13 is a simplified circuit diagram of a channel selector circuit using the switching circuit of FIG. 12.

In one embodiment of the first and second channel selectors, the 357 active channels in each cluster are logically linked with each other by a closed serpentine loop. Each of the 357 active channels for the cluster are connected to an output of the channel selector 320. Extra channels are normally distributed over the serpentine loop. This may be achieved by dividing the total 390 channels of one cluster into 6 groups of 11 and 27 groups of 12 channels, in which each group will have one of the additional channels. These additional channels are the same as a regular "active" channel except that they are not connected directly to an input of the first channel selector 220 and output of the second channel selector 320. These additional channels can be connected to an input/output only by means of "shifting". Each input/output is connected to a regular "active" channel but can shift a number of places in each direction (left or right) along the serpentine loop so that it is connected to a different regular "active" channel or to one of the additional channels. The maximum shift may be 2, 3, 4 or more places along the serpentine loop. It is calculated that, assuming a channel yield of at least 96%, a system yield of at least 98% can be achieved using a maximum shift of four in either direction. This can be implemented with multiplexing or switching circuits connecting one of every nine transmission channels (i.e. one "active" channel or one of the 4 channels to the left along the serpentine loop or one of the 4 channels to the right along the serpentine loop) to one input of the first channel selector 220 and one output of the second channel selector 320. FIGS. 12-14 show one possible embodiment for implementing this switching scheme.

FIG. 12 shows a switching circuit 322 for connecting an input i to an output o, and for shifting the input to an adjacent output if required. The switching circuit 322 comprises ten tri-state buffers 324 (labeled a to j) connected in two series circuits. Each buffer is arranged for passing or blocking a signal at its input. Each series circuit comprises five buffers connected in series, and the last buffer in each series circuit is arranged to send its output to the output o of the switching circuit 322. Each of the remaining buffers in each series circuit is arranged to send its output onward to the input of the next buffer in the series circuit and also to the input of a buffer in an adjacent switching circuit. Each of the buffers a-j is controllable to pass or block the signal at its input. Buffer control signals are generated and transmitted to each buffer to enable this control. The embodiment shown in FIG. 12 comprises two series of five buffers, although it will be apparent that a different number of buffers may be included in each series circuit and/or more series circuits may be included. Increasing the number of buffers in the switching circuit 322 will permit shifting of an input signal to a greater number of possible outputs.

The switching circuit may be configured to transfer a single signal from input to output, or to transfer multiplexed signals (e.g. time multiplexed signal comprising data, sync, clock signals etc.). The switching circuit may be constructed for transferring a set of parallel signals from input to output, where each input in the diagram of FIG. 12 represents a set of parallel inputs, each line represents a set of parallel lines, each buffer represents a set of buffers, one buffer for each line, and each output represents a set of parallel outputs. In this configuration, the switching circuit transfers a set of parallel input signals to a selected set of parallel output signals, e.g. 7 data signals, a sync signal, and a clock signal.

FIG. 13 shows a channel selector circuit 326 which comprises a number of series circuits 322 arranged in a ladder arrangement where each switching circuit 322 forms one "rung" of the ladder. The inputs of each rung (labeled n−4, n−3, n−2, etc.) form the inputs of the channel selector, and outputs of each rung (also labeled n−4, n−3, n−2, etc.) form the outputs of the channel selector. When the channel selector circuit 326 is used for the first channel selector 220, not all of the rung inputs will be connected to inputs of the channel selector so that channel selector 220 has more outputs than inputs. When the channel selector circuit 326 is used for the first channel selector 320, not all of the rung outputs will be connected to outputs of the channel selector so that channel selector 320 has more inputs than outputs.

Each buffer in each series circuit of each rung, except for the last buffer in each series circuit, has its output connected to an input of a buffer in a series circuit of an adjacent rung, the connections alternating so that successive buffer outputs are connected to buffer inputs of different ones of the series circuits of the adjacent rungs. In this way, when a buffer (except a last buffer) is activated to pass the signal at its input to its output, the signal is transferred along the series circuit and also onto one of the series circuits of one of the adjacent rungs. By selectively activating the buffers, a signal on the input of a particular rung can be sent directly to the output of that rung or shifted onto an adjacent rung and from there onto other adjacent rungs if desired, to permit direct unshifted output or shifting an input one or more rungs up or down the ladder to a desired output. Due to the arrangement of the inter-rung connections, the buffers can be selectively activated to permit shifting of an input across one or more intermediate rungs while still permitting the inputs of those intermediate rungs to be transmitted directly (unshifted) to their outputs. FIG. 13 illustrates one possible arrangement of connections between rungs, and many other arrangements are possible to implement the shifting. In FIG. 13, the inter-rung connections are arranged to connect directly neighboring rungs, each rung being connected to the next rung up or next rung down the ladder, but other arrangements are possible with inter-rung connections spanning several rungs.

FIG. 13 illustrates nine rungs although more rungs will normally be used, i.e. one rung per input/output of the channel selector. For example, for second channel selector 320, the ladder circuit may be arranged with 390 rungs, to provide 390 inputs and 357 outputs. For example, if the input n is connected to one of the additional channels, the output n of that rung would not be connected to an output of the channel selector. The inputs of the other rungs shown (n−4, n−3, n−2, n−1, n+1, n+2, n+3 and n+4) are connected to "active" channels and the outputs of these rungs (n−4, n−3, n−2, n−1, n+1, n+2, n+3 and n+4) are connected to outputs of the channel selector. Thus, the additional channel input n is not connected directly to an output of the second channel selector 320 but may be "shifted" to connect to any output up to four rungs up or four rungs down the ladder, i.e. input n can be connected to any on of outputs n−4, n−3, n−2, n−1, n+1, n+2, n+3 or n+4. The ladder may be formed into a continuous loop such as a serpentine loop so that every rung has adjacent rungs on either side so that each input can be shifted the desired number of places up or down within the channel selector. Each rung may be configured to transfer a set of parallel signals from input to output, as described above, where each set of parallel inputs for a rung is shifted together as a set via parallel lines, buffers and inter-rung connections, to a set of parallel outputs.

FIGS. 14A to 14I illustrate possible buffer activation patterns for the circuit of FIG. 13, to achieve direct unshifted transfer of an input to an output or shifting by up to four rungs (outputs) up or down the ladder. These buffer activation patterns provide a set of nine paths for transfer of an input to an output with a maximum shift of 4 rungs in either direction, i.e. an output n can receive a signal transferred from any of the inputs from n−4 to n+4. This set of paths may be selected in any combination so that the transferred signals do not interfere with each other, provided the paths from the inputs to the outputs do not "cross over" each other, i.e. an output n may receive its signal from an input which has a higher number than the input from which output n−1 gets its signal, and which has a lower number than the input from which output n+1 gets its signal.

Each of the 9 patterns describes a unique path with a pattern of 5 enabled buffers and 10 disabled buffers. These paths are defined such that if a path is chosen for a particular output, this path does not conflict with all allowed combinations of paths for the other outputs. The allowed number of path combinations for two successive outputs is 9+8+7+6+5+4+3+2+1=45. It will be apparent that other activation patterns are also possible to achieve the shifting, using the arrangement of connections in the embodiment of FIG. 13 or other circuit arrangements.

Figure 14A:
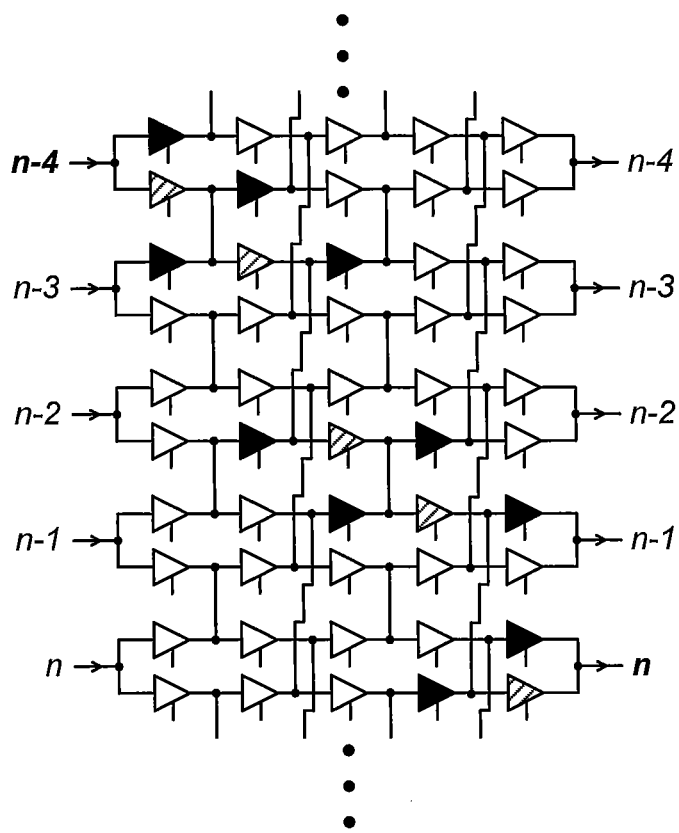
FIGS. 14A to 14I are simplified circuit diagrams of switching patterns for use in the channel selector circuit of FIG. 13.

FIG. 14A illustrates a shift of four places down the ladder, to transfer the input n−4 to the output n across three intermediate rungs. The buffers shown in solid black fill are switched into a tri-state high input impedance mode (i.e. disabled) to block the signal at the input of the buffer from being transferred to its output. The buffers shown with striped fill are activated to pass signals at their input to their output (i.e. enabled), and the buffers shown with white fill are not involved in the transfer illustrated and their state will depend on the desired transfer of other inputs in the channel selector circuit.

Figure 14B:
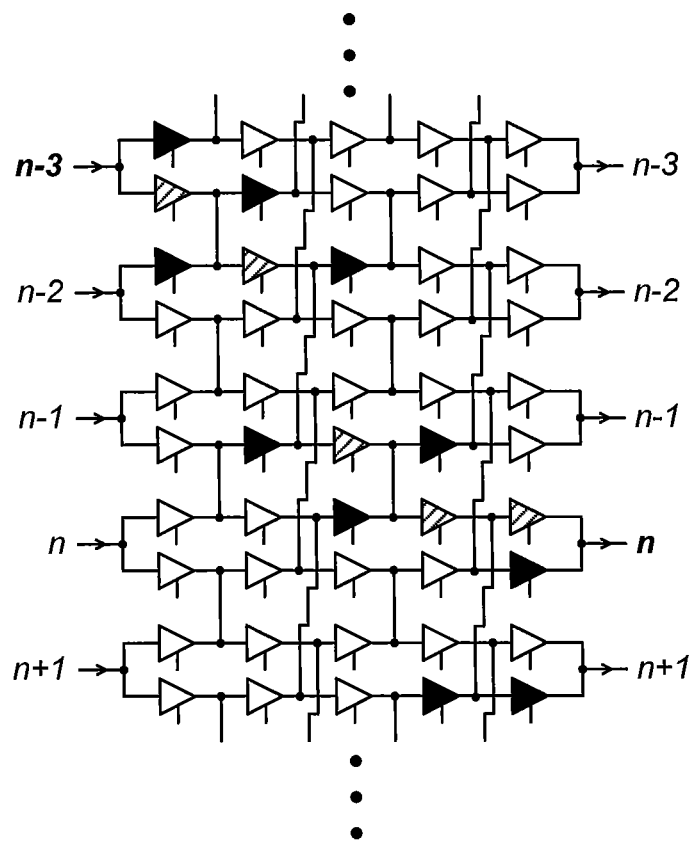
Figure 14C:
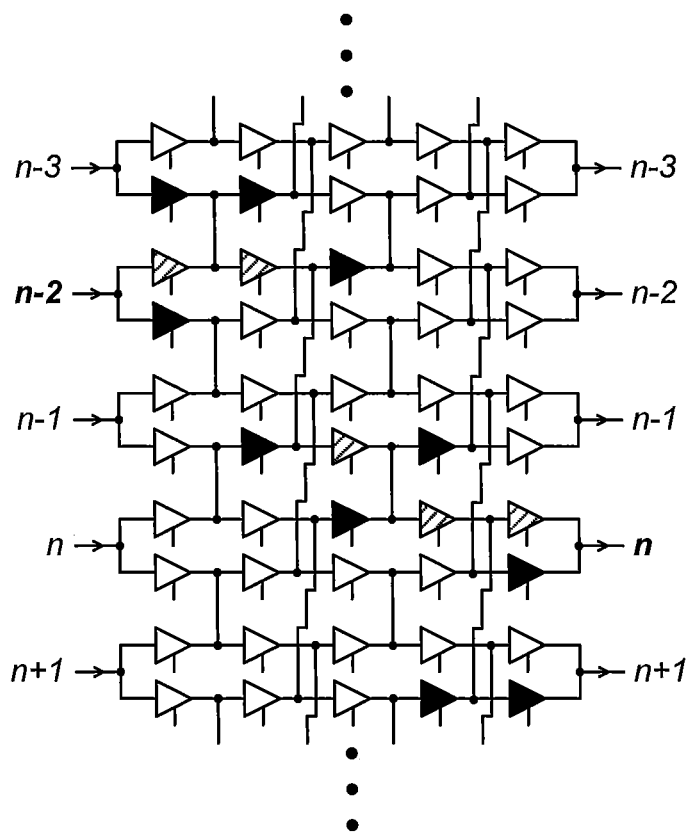
Figure 14D:
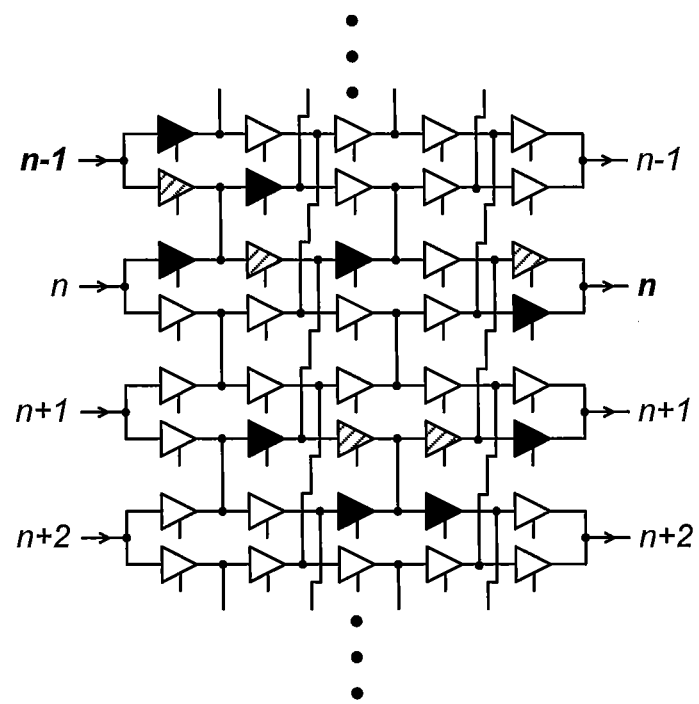
Figure 14E:
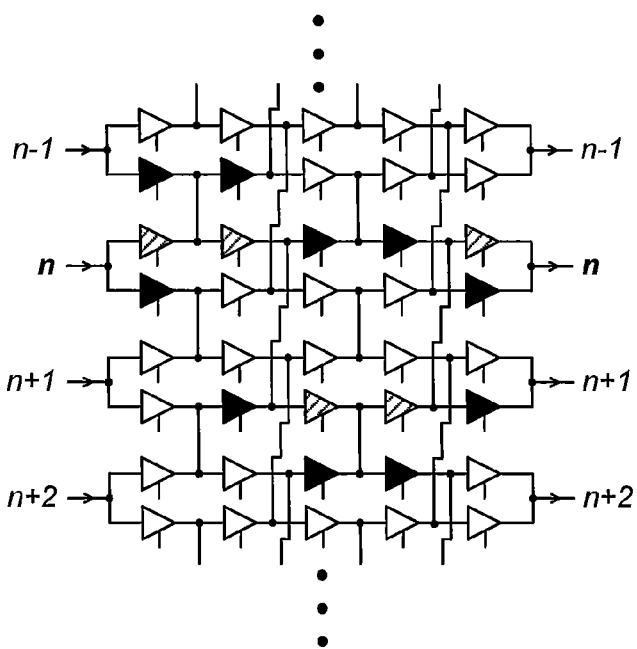
Figure 14F:
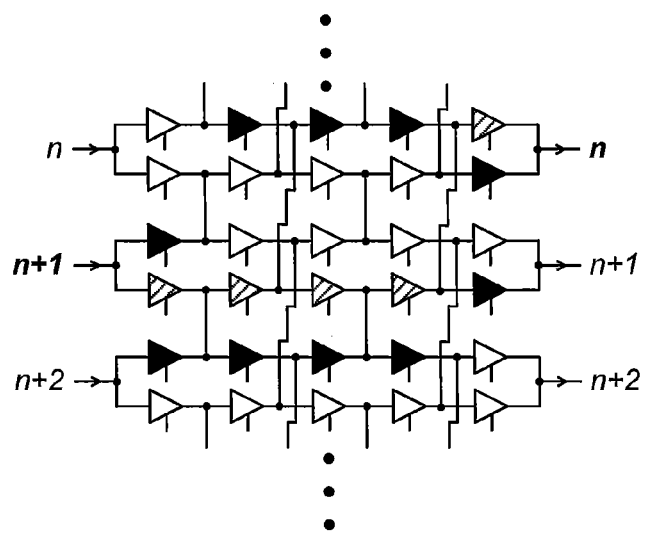
Figure 14G:
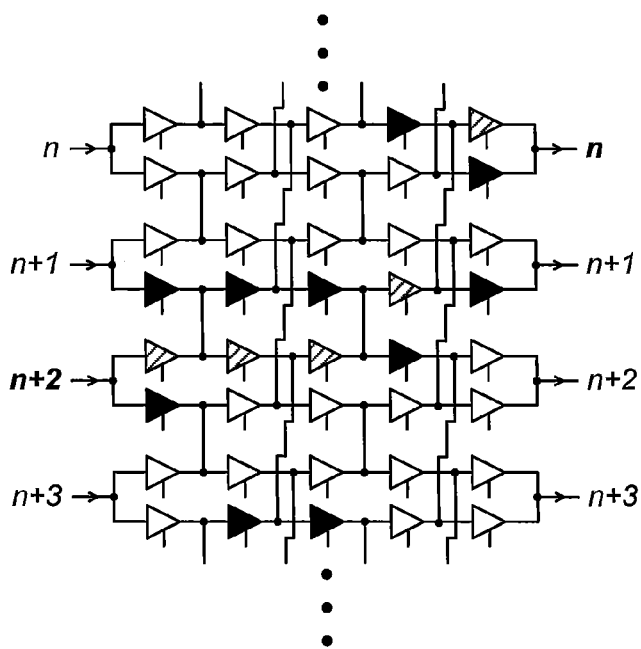
Figure 14H:
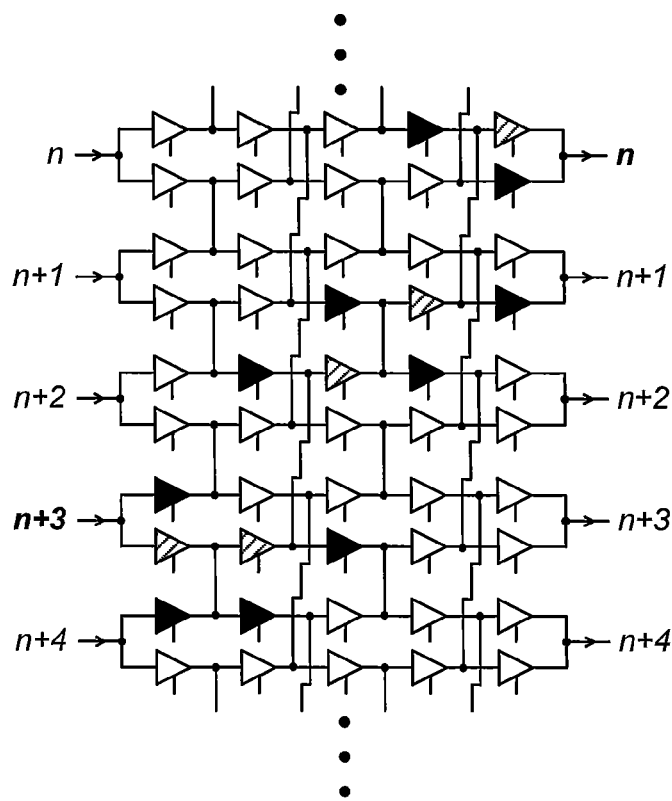
Figure 14I:
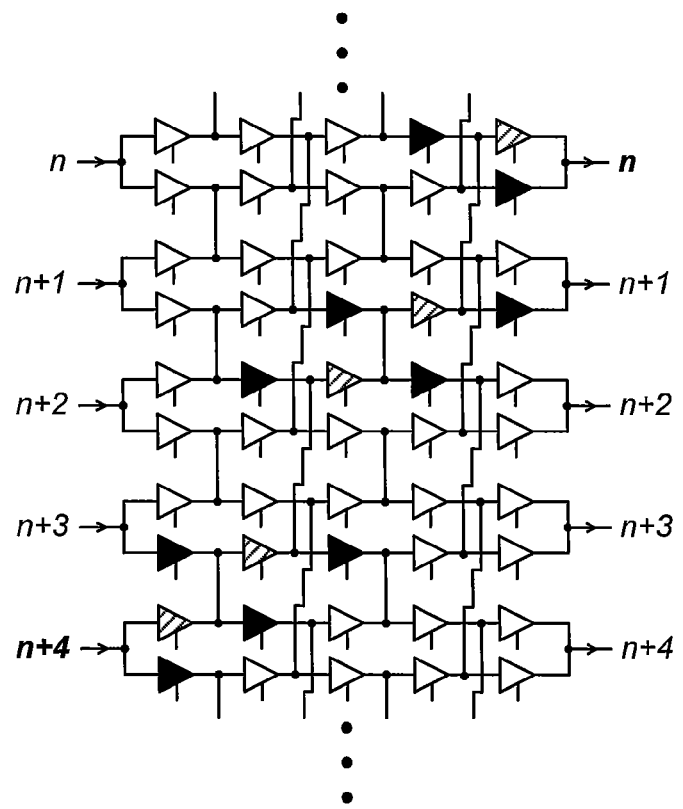

FIG. 14B illustrates a shift of three places down the ladder to transfer input n−3 to output n across two intermediate rungs. FIG. 14C illustrates a shift of two places down the ladder to transfer input n−2 to output n across one intermediate rung. FIG. 14D illustrates a shift of one place down the ladder to transfer input n−1 to output n of the next rung down. FIG. 14E illustrates a direct unshifted transfer of input n to output n of the same rung. FIG. 14F illustrates a shift of one place up the ladder to transfer input n+1 to output n of the next rung up. FIG. 14G illustrates a shift of two places up the ladder to transfer input n+2 to output n across one intermediate rung. FIG. 14H illustrates a shift of three places up the ladder to transfer input n+3 to output n across two intermediate rungs. FIG. 14I illustrates a shift of four places up the ladder to transfer input n+4 to output n across three intermediate rungs.

An algorithm may be used to determine the required shifting for each input of first channel selector 220 or output of second channel selector 320, i.e. the mapping of channels to input/outputs. In one embodiment, a lookup table is created indicating for each input/output of the channel selectors the possible channels to which it may be connected. The ordering of the channels to which an input/output can be connected is important and is maintained. A control circuit may be arranged to execute the algorithm and generate control signals for control of the channel selector, e.g. to control the buffers of channel control circuit 326.

In one embodiment, the algorithm includes an outer loop and an inner loop for evaluating possible mappings. The outer loop of the algorithm runs through the sorted list of channel selector inputs/outputs and creates a list of used channels, adding all defective channels to this list. For each channel selector input/output, the algorithm performs an inner loop through the list of channel selector inputs/outputs, starting from the current input/output to the end of the list and then from the beginning of the list back to the current input/output. For each input/output in the inner loop, the algorithm looks for the first channel in the lookup table, in the order defined in the table, that the input/output can be connected to which has not been used yet or is not defective. If for an input/output no channel can be found to map to, the algorithm stops the inner loop and resumes processing on the outer loop. If a channel is found to map to the input/output, the channel that just has been mapped is added to the list of used channels and the algorithm continues in the inner loop with mapping the next input/output. The used channel list is used to determine each time if a channel is available.

If for the current input/output in the outer loop as a starting point, all inputs/outputs could be mapped to a channel, then a solution has been found for mapping non-defective channels to all inputs/outputs. Otherwise, the algorithm moves to the next input/output in the outer loop and uses that as the next starting point for the inner loop. If no inputs/outputs as a starting point are available anymore, the outer loop ends also and no solution is found.

Figure 15:
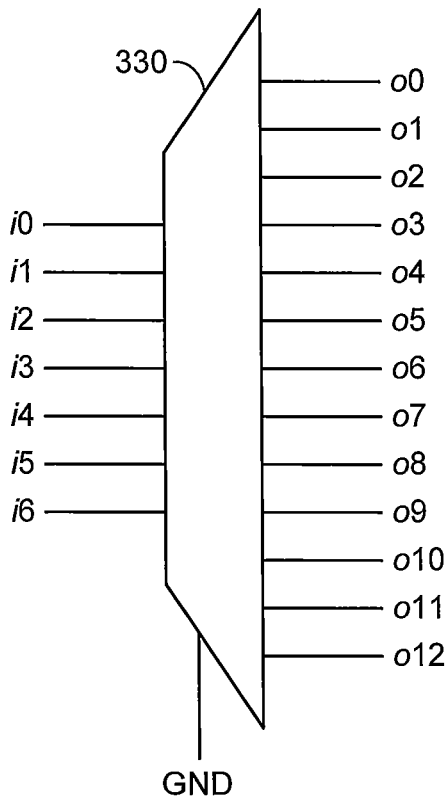
FIG. 15 is schematic diagram of a beam selector.

In one embodiment, the channel selector 320 for each cluster provides its outputs in 51 groups of 7 outputs each, for a total of 357 outputs. The beam selectors 330 receive the outputs from the channel selector 320 and switch the outputs to the relevant blanker elements. In the embodiment described above with a dual-pass scan and 7-of-13 selection of transmission channels for the first scan, each beam selector 330 receives one group of 7 outputs from the channel selector and switches them to 7 out of 13 possible outputs for the first scan, and beam selector 330 switches 6 transmission channel inputs to 6 out of 13 possible outputs for the second scan. In one embodiment, 7 subbeams of a row of 13 consecutive subbeams are selected for the first scan and the beam selectors 330 operate to direct data and control signals from 7 channels output from the channel selector 320 to the deflector matrices for the selected 7 subbeams of a row of 13 subbeams. For the second scan, 6 subbeams of the row of 13 subbeams are selected and the beam selectors 330 operate to direct data and control signals from 6 channels to the deflector matrices for the selected 6 subbeams. In this way, the beam selector 330 provides for switching of a set of transmission channels to a corresponding subset of blanker elements selected from a larger set, to achieve the transmission of data for control of a selected subset of the patterned beams of the lithography machine corresponding to the transmitted pattern data for one scan of a multiple scan exposure. FIG. 15 is a schematic diagram of a 7-to-13 beam selector 330, having 7 inputs (labeled i0 to i6) and 13 outputs (labeled o0 to o12). The beam selector may provide for possible input-to-output mapping such as shown in the table below for connecting the beam selector inputs to the outputs:

| Input | Possible output mapping | | | | | | |
|---|---|---|---|---|---|---|---|
| i0 | o0 | o1 | o2 | o3 | o4 | o5 | o6 |
| i1 | o1 | o2 | o3 | o4 | o5 | o6 | o7 |
| i2 | o2 | o3 | o4 | o5 | o6 | o7 | o8 |
| i3 | o3 | o4 | o5 | o6 | o7 | o8 | o9 |
| i4 | o4 | o5 | o6 | o7 | o8 | o9 | o10 |
| i5 | o5 | o6 | o7 | o8 | o9 | o10 | o11 |
| i6 | o6 | o7 | o8 | o9 | o10 | o11 | o12 |

Figure 16:
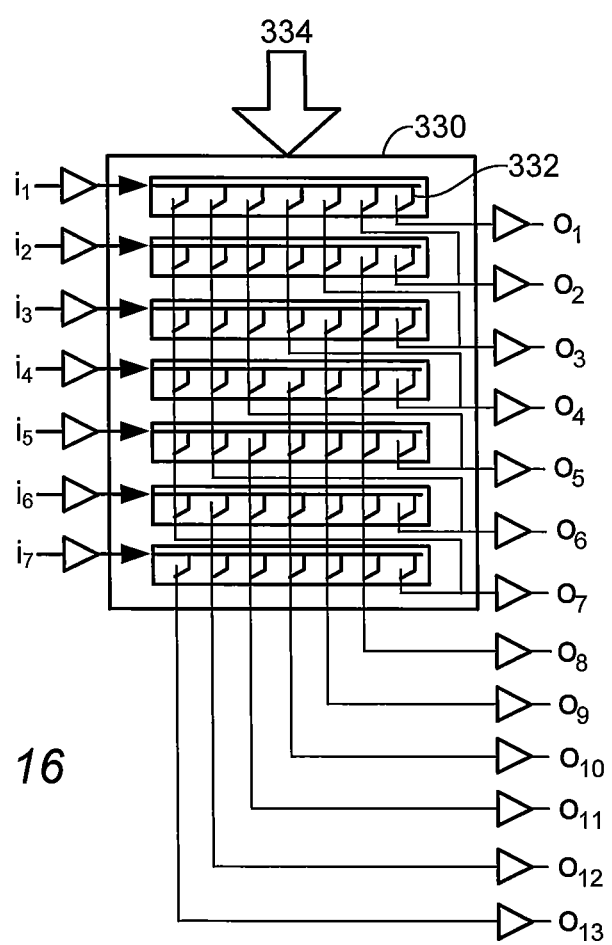
FIG. 16 is a circuit diagram of one embodiment of a beam selector showing a possible arrangement of switches in the beamlet blanker array.

FIG. 16 is a simplified circuit diagram of one embodiment of a beam selector 330 showing a possible arrangement of switches. In this embodiment, a 7 to 13 beam selector is shown implemented as a 7×7 array of switches 332 for switching seven inputs $i_1$ to $i_7$ to the thirteen outputs $O_1$ to $O_{13}$, under control of beam selector control signals 334 for implementing the above input-to-output mapping.

Demultiplexers 340 receive the outputs from the beam selectors 330. The demultiplexers are optional, and are used when the beam data/control signals are transmitted as multiplexed signals for control of multiple beamlets. In the embodiment described above with 49 beamlets per patterned beam, the beam signals may be transmitted as a multiplexed signal over one channel, the signal containing signals for each of the 49 beamlets. For example, the signals may be time multiplexed for transmission and demultiplexed into a series of data and control signals for each beamlet. The demultiplexed beamlet signals are then transferred to the matrix 350 of beamlet blanker elements 152. The beamlet blanker elements 152 modulate or switch the individual beamlets of each patterned beam under control of the demultiplexed beamlet signals to achieve exposure of the target according to the pattern data.

Multiplexing, Framing, Coding, and Synchronization

Figure 11A:
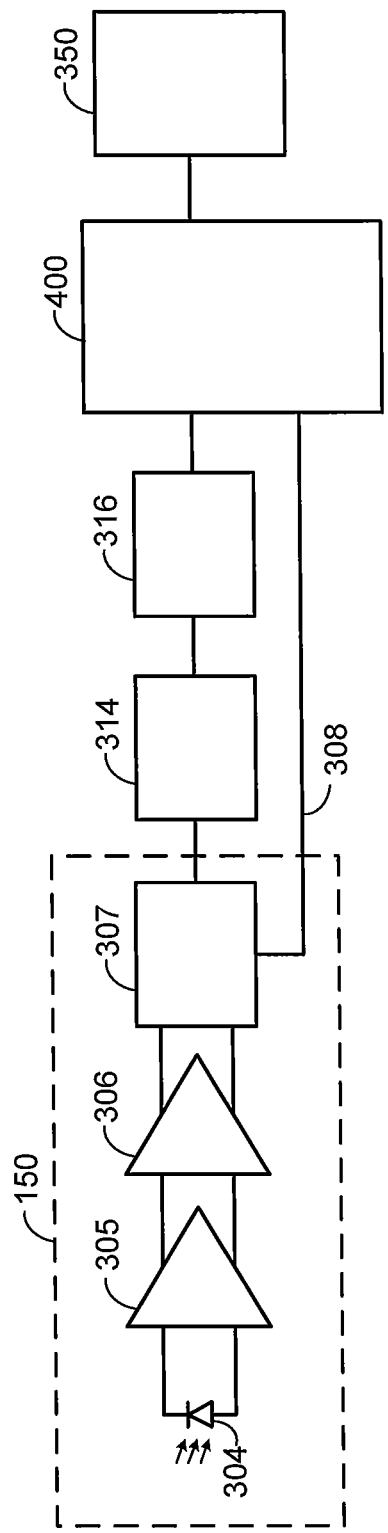
FIGS. 11A and 11B are block diagrams of an embodiment signal receiving, switching and demultiplexing circuitry for a beamlet blanker array.
Figure 11B:
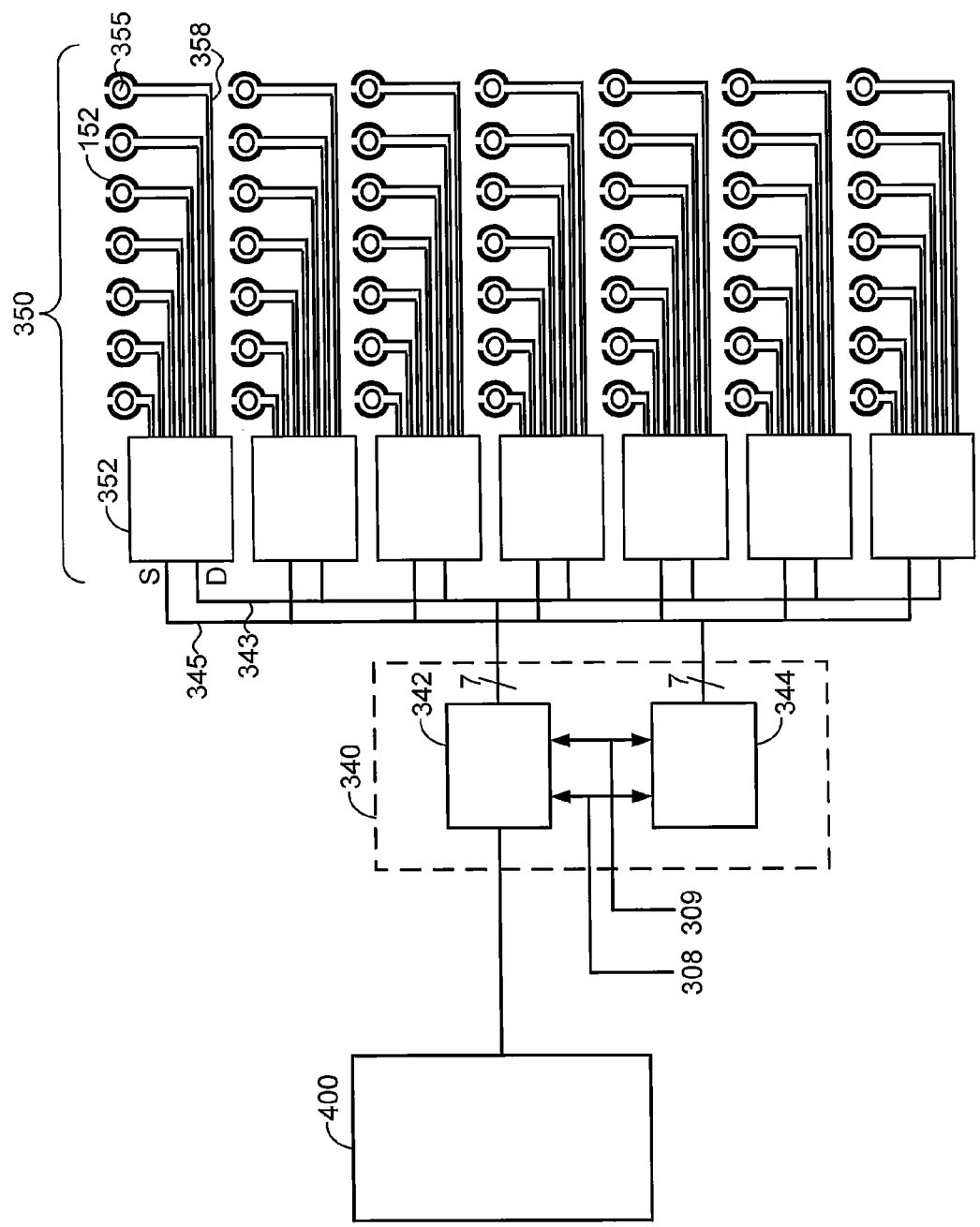

To reduce system costs, one optical fiber may be used for controlling many blanker elements, each blanker element for modulating a single beamlet. In one embodiment, successive control bits sent over each fiber are used for controlling successive blanker elements of the beamlet blanker array (i.e. for controlling a series of beamlets). In one embodiment, each fiber comprises a channel transmitting control information for 49 subbeams of a single patterned beam. This control information can first be buffered before being applied to the blanker electrodes for each beamlet, or the control information and be applied directly without buffering. A buffer could be provided on the beamlet blanker array for this purpose. A schematic diagram of a data path with interleaved/multiplexed subbeams is shown in FIGS. 11A and 11B, with a demultiplexing scheme using row and column selectors to decode the multiplexed subchannel to separate the individual control bits for each beamlet.

For synchronization purposes and to indicate which bit in the control information stream belongs to which beamlet, some kind of framing is preferably used. Frame start indicator bits (e.g. 7 bits) may be used in a recurring pattern to which a framer on the beamlet blanker will synchronize. When a DC balanced transmission sequence is required for the use of AC-coupled optical transmitters and automatic threshold adjustment on the photo diode side, some type of suitable encoding is preferably used. One example is 8b/10b coding which maps 8-bit symbols to 10-bit symbols to achieve DC-balance and bounded disparity, while providing enough state changes to permit clock recovery. However, this type of coding results in a higher bitrates, with 8b/10b coding adding 25% to the bitrate. Framing and encoding of the signal can also be combined, e.g. by using specific encoded words to mark the start of a frame.

Each channel will carry data for a number of individual beamlets (e.g. 49 beamlets). The information will be transmitted in a serial manner from the data path to the blanker Depending on the demultiplexing and synchronization implementation on the blanker, there may be a need to compensate for a "blanker timing offset" resulting from the blanker receiving control information for different beamlets at different times due to the serial data transmission. There are several beamlet synchronization options possible. The synchronization implementation mainly depends on the possibility for implementation on the blanker.

Synchronization of the beamlets may be performed in different ways, for example synchronize all beamlets to one synchronization signal, synchronize all beamlets in a column, synchronize all beamlets in a row, or do not synchronize the beamlets. For an embodiment with 49 beamlets per patterned beam arranged in a 7×7 array, to synchronize all beamlets to one synchronization signal the control data for 49 beamlets may be buffered and applied synchronously to each of the 49 blanker electrodes for switching the beamlets. To synchronize all beamlets in a column, the control data for 7 channels in a each column may be buffered and synchronously applied to the 7 blanker electrodes for that column of beamlets. To synchronize all beamlets in a row, the control data for 7 channels in a each row may be buffered and synchronously applied to the 7 blanker electrodes for that row of beamlets. When no synchronization is performed, the control data of all 49 beamlets may be directly applied to the blanker electrodes as the data is received by the blanker.

For column, row or no synchronization, individual beamlet pixel timing will be different. When there are timing differences between beamlets, the differences can be compensated for by shifting pixels in the x-direction. This shift will always be in the subpixel range. Compensation is typically only possible when rasterization is executed in real-time because the shift depends on the row-to-beamlet association.

FIGS. 11A and 11B are diagrams showing data path elements for a single channel, for an embodiment in which one channel provides data for a single patterned beam comprising 49 individual beamlets. In FIG. 11A, photodiode 304 receives a serial optical beam data/control signal from the data path and generates a corresponding electrical serial beam signal, which is input to amplifier 305 and level adjust 306. The clock and data recovery (CDR) 307 generates a clock from a frequency reference and phase aligns the clock 308 to the transitions in the received serial beam signal. The serial signal is converted to a parallel signal in data deserializer 314 (e.g. an 8-bit encoded parallel signal), and this signal is decoded to generate a parallel signal (e.g. 7-bits of data) representing the data for control of a group of 7 beamlets. Control signals may also be included with the beam data signal, such as a sync signal and/or clock signal, to result in an 8 or 9-bit parallel beam signal. The parallel beam data/control signal is then input to switch 400 for switching to the appropriate beamlet deflector matrix 350 for modulation of a single patterned beam comprising 49 beamlets.

In FIG. 11B, the serial beam signal is switched to the appropriate deflector matrix and is received by shift register 342. Shift register 342 generates data signals 343 which are output to the memory cell units 352, and row counter 344 generates sample signals 345 which clock the data signals 343 into the memory cell units 352. The distribution of signals to the deflectors may also be by column. Each memory cell unit 352 comprises memory cells for storing the beamlet control data for 7 beamlets, the 7 memory cell units 352 thus storing beamlet data for modulation of 49 beamlets of a single patterned beam.

The beamlet control data is clocked out from the memory cell units and transferred to the individual electrodes of the beamlet blanker elements 356 via row lines 358. Each beamlet blanker element 152 provides for the modulation of a beamlet passing through an aperture 355 in the beamlet blanker array of the lithography machine. Other arrangements are of course possible for addressing of the individual beamlet blanker elements.

Reduction in Required Data Path Capacity

The use of a multi-pass scan with two scans results in the lithography machine writing at half its maximum capacity. This reduction of the writing capacity enables a significant decrease the amount of hardware required for the data path.

The concept of a node is used in the following description of one embodiment of a data path. A node has Y (optical) channels connected and has available X processing units. The electrical to optical (E/O) converters that are commercially available typically contain 12 channels (i.e. Y=12). The E/O converter (e.g. laser diodes) convert the electrical control data from the processing units to optical data transmitted over optical fibers to the blanker array of the lithography machine. The processing units (e.g. field programmable gate arrays, FPGA's) driving the E/O converters contain X number of channels. An X*Y crosspoint may be used to switch any of the processing units to any of the O/E converters. The X*Y crosspoint may be a separate device or may be integrated in the processing units. With the crosspoint it is possible to route any of the processing unit outputs (X) to any of the data path outputs (Y).

If some optical channels fail, first the possibilities for a shift between the first and second scan of a two-scan exposure may be determined where all stripe positions are covered by at least one properly functioning channel. When the possible shift positions are known, it is determined whether the available processing units are allocated between the scans and cover 100% of the stripes.

Reducing the number of processing units per node would significantly reduce the amount of hardware required for the data path, but will slightly decrease robustness. A 50% reduction (e.g. 12/6 configuration) is the lower limit for reducing the number of processing units per node for a dual-pass scan. Configurations close to 50% are particularly sensitive to small clusters of errors (e.g. 5 errors in a cluster). A 12/6 configuration is thus less preferred than a 12/7 configuration, which has much reduced sensitivity to error clusters. The 12/7 configuration provides a reasonable lower limit for the number of processing units per 12 channels. The number of active channels is preferably larger than the numbers of stripes to be written (e.g. 2% larger) for good robustness. Increasing the number of active channels increases the robustness significantly. Loss of robustness because of reducing the number of processing units per node may be easily compensated by using additional channels. Large error clusters (e.g. greater than 5) will decrease the robustness dramatically.

The invention has been described by reference to certain embodiments discussed above. It should be noted various constructions and alternatives have been described, which may be used with any of the embodiments described herein, as would be know by those of skill in the art. Furthermore, it will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

The invention claimed is:

1. A data path for transmitting pattern data to a maskless lithography system, for modulating a plurality of charged particle beamlets generated by the lithography system for exposing a field of a target, the data path comprising:
   a plurality of transmission channels, for transmitting the pattern data to the lithography system;
   first and second channel selectors connecting a subset of selected, transmission channels among the transmission channels for transmitting pattern data;
   wherein the first channel selector is connected between a processing system and the transmission channels, and the second channel selector is connected between the transmission channels and the lithography system;
   wherein the transmission channels include enough channels to transmit the pattern data for exposing the field of the target, plus an additional number of channels available as spare channels, and
   wherein the first and second channel selectors are adapted to operate in conjunction with each other to connect a subset of selected transmission channels from among the transmission channels including the spare channels, the subset of selected transmission channels excluding failed transmission channels, for transmitting the pattern data.

2. The data path according to claim 1, wherein the first channel selector and/or the second channel selector comprises as number of switching, circuits arranged in parallel, wherein a first one of the switching circuits is arranged for transmitting an input of the switching circuit to an output of one of a set of adjacent switching circuits.

3. The data path according to claim 2, wherein the switching circuits comprise a plurality of switches connected in two or more series circuits, each switch controllable for passing or blocking a signal at its input.

4. The data path according to claim 3, wherein each switch of a subset of the switches in the series circuits is arranged for sending its output to an input of a next switch the series circuit and also to an input of a buffer in an adjacent switching circuit.

5. The data path according to claim 2, wherein each switching circuit comprises a plurality of switches connected in two or more series circuits, each switch controllable for passing or blocking a signal at its input, and wherein each of a plurality of the switches in each series circuit has an output connected to an input of a switch in a series circuit of an adjacent rung, the connections alternating so that successive switch outputs are connected to switch inputs of different ones of the series circuits of the adjacent rungs.

6. The data path according to claim 5, wherein the channel selector is configured to transmit an input of one of the switching circuits to an output of an adjacent switching circuit along a path defined by selective activation of the switches in the switching circuits according to a predefined pattern.

7. The data path according to claim 2, wherein the channel selector is configured to transmit an input of one of the switching circuits across one or More intermediate switching circuits to an output of another switching circuit.

8. The data path according to claim 1, wherein the data path comprises a pattern streaming system for receiving the pattern data from the processing system and generating the streamed beamlet modulation data, and wherein the first channel selector is connected between the processing system and the pattern streaming system.

9. The data path according to claim 8, wherein the pattern streaming system comprises a plurality of pattern streamers comprised in the data path, each pattern streamer for receiving a portion of the pattern data and generating streamed beamlet data signals for modulating a corresponding group of beamlets, preferably wherein the first channel selector is connected between the processing system and the pattern streamers.

10. A maskless lithography system for exposing a target according to pattern data, the system comprising:
    an electron optical column for generating charged particle beamlets for exposing the target, the electron optical column including a beamlet blanker array for modulating the beamlets, the beamlet blanker array including receivers for receiving streamed beamlet data signals and a plurality of beamlet blanker elements for modulating the beamlets in accordance with the streamed beamlet data signals; and
    a data path according to claim 8 wherein:
    the processing system is configured for storing and processing the pattern data;
    the pattern streaming system is configured for receiving the pattern data from the processing system and for generating the streamed beamlet data signals;
    the transmission channels including spare channels are configured for transmitting the pattern data from the processing system to the beamlet blanker elements, and
    the second channel selector is connected between the transmission channels and the beamlet blanker elements.

11. The system according to claim 10, wherein the second channel selector is connected between the receivers of the beamlet blanker array and the beamlet blanker elements of the beamlet blanker array, for connecting selected receivers to selected beamlet blanker elements to establish transmission channels for transmitting the pattern data for modulation of the beamlets.

12. The system according to claim 10, wherein the receivers, the second channel selector, and the beamlet blanker elements, are all fabricated on a substrate of the beamlet blanker array.

13. The system according to claim 10, wherein each receiver is connected for transmission of beamlet data signals to a group of beamlet blanker elements, and wherein the data path comprises a plurality of multiplexers and demultiplexers, each multiplexer for multiplexing beamlet data signals for transmission over a transmission channel for control of one of the groups of beamlets.

14. The system according to claim 10, configured for exposing the entire surface to be exposed in two or more exposures, and for selecting different subsets of beamlets for each of the two or more exposures;

wherein the system comprises a control unit configured for allocating a selected subset of the beamlets for exposing a selected subset of the surface to be exposed during an exposure; and wherein the data path comprises first and second beam selectors for coupling a selected subset of the pattern data via the transmission channels to a selected subset of the beamlet blanker elements during an exposure;

wherein the selected subset of the pattern data corresponds to the selected subset of the surface to be exposed during the exposure, and the selected subset of the beamlet blanker elements are for modulation of the selected subset of beamlets for the exposure.

15. A channel selector for use in the data path of claim 1, for transmitting data via a plurality of transmission channels, the channel selector adapted to connect a subset of selected transmission channels among the plurality of transmission channels, wherein each input of the channel selector may be connected to a limited subset of the transmission channels, wherein the channel selector comprises a number of switching circuits arranged in parallel, wherein a first one of the switching circuits is arranged for transmitting an input of the switching circuit to an output of one of a set of adjacent switching circuits, wherein the switching circuits comprise at plurality of switches connected in two or more series circuits, each switch controllable for passing or blocking a signal at its input, wherein each switch of a subset of the switches in the series circuits is arranged for sending its output to an input of a next switch in the series circuit and also to an input of a buffer in an adjacent switching circuit.

16. The channel selector according to claim 15, wherein the set of adjacent switching circuits comprises a plurality of the switching circuits arranged on both sides of the first switching circuit.

17. The channel selector according to claim 16, wherein each switching circuit comprises a plurality of switches connected in two or more series circuits, each switch controllable for passing or blocking a signal at its input, and wherein each of a plurality of the switches in each series circuit has an output connected to an input of as switch in a series circuit of an adjacent rung, the connections alternating so that successive switch outputs are connected to switch inputs of different ones of the series circuits of the adjacent rungs.

18. The channel selector according to claim 16, wherein the channel selector is configured to transmit an input of one of the switching circuits across one or more intermediate switching circuits to an output of another switching circuit.

* * * * *